United States Patent
Back et al.

(10) Patent No.: US 11,545,554 B2
(45) Date of Patent: Jan. 3, 2023

(54) SEMICONDUCTOR DEVICE

(71) Applicant: SAMSUNG ELECTRONICS CO., LTD., Suwon-si (KR)

(72) Inventors: Doosan Back, Seoul (KR); Dongoh Kim, Daegu (KR); Gyuhyun Kil, Hwaseong-si (KR); Jung-Hoon Han, Hwaseong-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 17/406,162

(22) Filed: Aug. 19, 2021

(65) Prior Publication Data

US 2022/0190132 A1    Jun. 16, 2022

(30) Foreign Application Priority Data

Dec. 14, 2020  (KR) .................. 10-2020-0174793

(51) Int. Cl.
*H01L 29/423* (2006.01)
*H01L 29/417* (2006.01)
*H01L 29/51* (2006.01)

(52) U.S. Cl.
CPC .. *H01L 29/42368* (2013.01); *H01L 29/41725* (2013.01); *H01L 29/513* (2013.01)

(58) Field of Classification Search
CPC ......... H01L 29/42368; H01L 29/41725; H01L 29/513; H01L 27/108; H01L 21/823468; H01L 21/823462; H01L 27/10897; H01L 27/1116
See application file for complete search history.

(56) References Cited

U.S. PATENT DOCUMENTS

| | | | |
|---|---|---|---|
| 8,907,425 B2 | 12/2014 | Itou et al. | |
| 9,000,539 B2* | 4/2015 | Mehrotra | H01L 29/66545 438/197 |
| 9,530,863 B1 | 12/2016 | Zhang et al. | |
| 9,583,591 B2 | 2/2017 | Chuang et al. | |
| 9,660,057 B2 | 5/2017 | Liu et al. | |
| 9,786,785 B2 | 10/2017 | Kim et al. | |
| 10,158,000 B2 | 12/2018 | Lee et al. | |
| 2010/0038715 A1 | 2/2010 | Babich et al. | |
| 2013/0277743 A1* | 10/2013 | Jagannathan | H01L 21/283 257/407 |

* cited by examiner

*Primary Examiner* — Mohammed R Alam
(74) *Attorney, Agent, or Firm* — Volentine, Whitt & Francos, PLLC

(57) ABSTRACT

A semiconductor device includes a gate stack including a gate insulating layer and a gate electrode on the gate insulating layer. The gate insulating layer includes a first dielectric layer and a second dielectric layer on the first dielectric layer, and a dielectric constant of the second dielectric layer is greater than a dielectric constant of the first dielectric layer. The semiconductor device also includes a first spacer on a side surface of the gate stack, and a second spacer on the first spacer, wherein the second spacer includes a protruding portion extending from a level lower than a lower surface of the first spacer towards the first dielectric layer, and a dielectric constant of the second spacer is greater than the dielectric constant of the first dielectric layer and less than a dielectric constant of the first spacer.

20 Claims, 29 Drawing Sheets

SEMICONDUCTOR DEVICE

CROSS-REFERENCE TO RELATED APPLICATION

This U.S. non-provisional patent application claims priority under 35 U.S.C. § 119 to Korean Patent Application No. 10-2020-0174793 filed on Dec. 14, 2020 in the Korean Intellectual Property Office, the subject matter of which is hereby incorporated by reference.

BACKGROUND

The inventive concept relates generally to semiconductor devices, and more particularly to semiconductor devices including a spacer structure provided on a gate electrode in a peripheral circuit region.

Contemporary and emerging semiconductor devices are characterized by their small size, expanded functionality and low cost. As such, semiconductor devices are increasingly important components in the electronic industry. However, demands for ever higher integration density continue to motivate the design and implementation of semiconductor devices. In order to increase the integration density of semiconductor devices, it has been customary to reduce pattern linewidths. However, novel and expensive exposure technologies are required to further reduce pattern linewidths, and this requirement tends to drive up both the complexity and cost of semiconductor devices. Accordingly, a variety of studies have been directed to new technologies and approaches to increasing integration density of semiconductor devices.

SUMMARY

Embodiments of the inventive concept provide semiconductor devices exhibiting high reliability, less complex fabrication, and reduced cost.

According to an embodiment of the inventive concept, a semiconductor device may include; a gate stack including a gate insulating layer and a gate electrode on the gate insulating layer, the gate insulating layer including a first dielectric layer and a second dielectric layer on the first dielectric layer, wherein a dielectric constant of the second dielectric layer is greater than a dielectric constant of the first dielectric layer, a first spacer on a side surface of the gate stack, and a second spacer on the first spacer, wherein the second spacer includes a protruding portion extending from a level lower than a lower surface of the first spacer towards the first dielectric layer, and a dielectric constant of the second spacer is greater than the dielectric constant of the first dielectric layer and less than a dielectric constant of the first spacer.

According to an embodiment of the inventive concept, a semiconductor device may include; a gate stack on a substrate, the gate stack including a gate insulating layer and a gate electrode on the gate insulating layer, the gate insulating layer including a first dielectric layer and a second dielectric layer on the first dielectric layer, wherein a dielectric constant of the second dielectric layer is greater than a dielectric constant of the first dielectric layer, a spacer structure on a side surface of the gate stack, the spacer structure including a first spacer and a second spacer on the first spacer, wherein a dielectric constant of the second spacer is less than a dielectric constant of the first spacer, an interlayer insulating layer covering the spacer structure, and a contact plug penetrating the interlayer insulating layer to connect the substrate, wherein the contact plug includes a first side surface adjacent to the second spacer and a second side surface opposite to the first side surface, and the first side surface has a sunken region recessed towards the second side surface.

According to an embodiment of the inventive concept, a semiconductor device may include; a first dielectric layer on a substrate, the first dielectric layer having a side surface defining a concave portion recessed towards a center of the first dielectric layer, a second dielectric layer on the first dielectric layer, wherein a dielectric constant of the second dielectric layer is greater than a dielectric constant of the first dielectric layer, a gate electrode on the second dielectric layer, a gate capping pattern on the gate electrode, a first spacer on a side surface of the second dielectric layer and a side surface of the gate electrode, a second spacer on the first spacer, a third spacer between the first spacer and the second spacer and filling at least a portion of the concave portion, an interlayer insulating layer covering the third spacer and the gate capping pattern, and a contact plug penetrating the interlayer insulating layer to connect the substrate, wherein a dielectric constant of the second spacer is less than the dielectric constant of the first spacer and greater than a dielectric constant of the third spacer.

BRIEF DESCRIPTION OF THE DRAWINGS

The inventive concept may be more clearly understood upon consideration of the following detailed description together with the accompanying drawings, in which.

DETAILED DESCRIPTION

Throughout the written description and drawings, like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
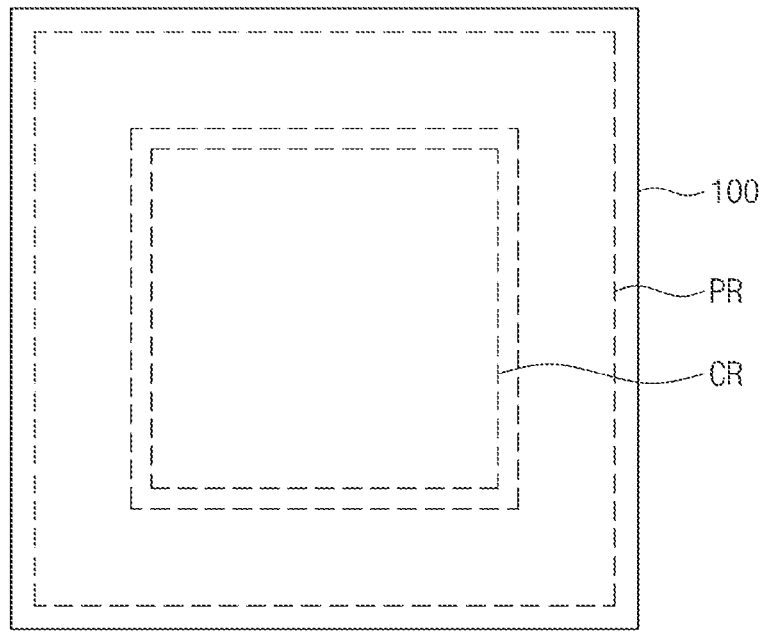
FIG. 1 is a plan (or top-down) view illustrating a general structure of a semiconductor device according to embodiments of the inventive concept.

FIG. 1 is a plan view illustrating the general structure of a semiconductor device according to embodiments of the inventive concept.

Referring to FIG. 1, the semiconductor device may include a substrate 100 including a cell region CR and a peripheral circuit region PR surrounding the cell region CR. The substrate 100 may be formed of (or include) at least one semiconductor material (e.g., silicon (Si) and/or germanium (Ge)) and/or compound semiconductor materials (e.g., SiGe, SiC, GaAs, InAs, and InP). The substrate 100 of FIG. 1 is assumed to be a silicon substrate.

The cell region CR may be a region more centrally disposed on the substrate 100 relative to the peripheral region PR. The cell region CR may constitute a memory cell region of a volatile memory device or a memory cell region of a nonvolatile memory device. The cell region CR may include a number of unit memory cells, each of which includes a transistor and a capacitor, or a switching device and a variable resistor. In some embodiments, the cell region CR of FIG. 1 may be a memory cell region for a dynamic random access (RAM) memory (DRAM) device, a magnetic RAM (MRAM) device, a static RAM (SRAM) device, a phase change RAM (PRAM) device, a resistance RAM (RRAM) device, or a ferroelectric RAM (FRAM) device.

The peripheral circuit region PR may be disposed adjacent to the cell region CR. For example, the peripheral circuit region PR may be provided between an edge of the substrate 100 and the cell region CR to substantially surround the cell region CR. Peripheral circuits associated with the memory cells in the cell region CR may be formed on the peripheral circuit region PR. Exemplary peripheral circuits include word line drivers, sense amplifiers, row and column decoders, control circuits, voltage generators, logic circuits, etc. The peripheral circuit region PR may be, for example, a core/peripheral region.

Figure 2:
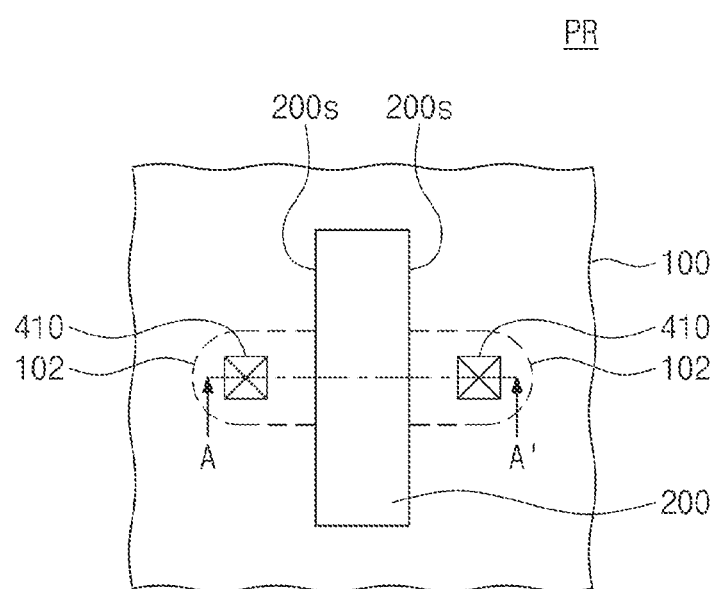
FIG. 2 is an enlarged plan view illustrating a portion of a peripheral circuit region of a semiconductor device according to embodiments of the inventive concept.
Figure 3:
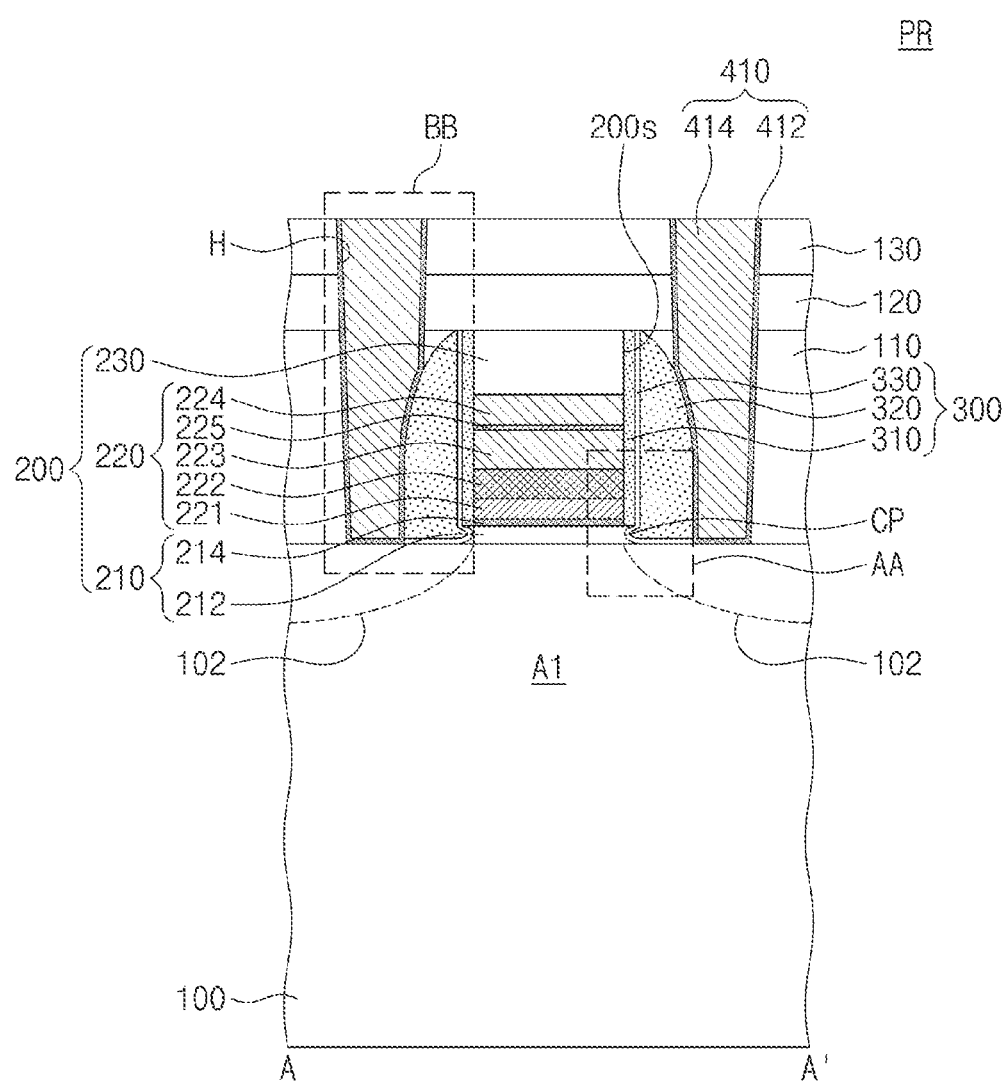
FIG. 3 is a cross sectional view taken along line A-A' of FIG. 2.
Figure 4A:
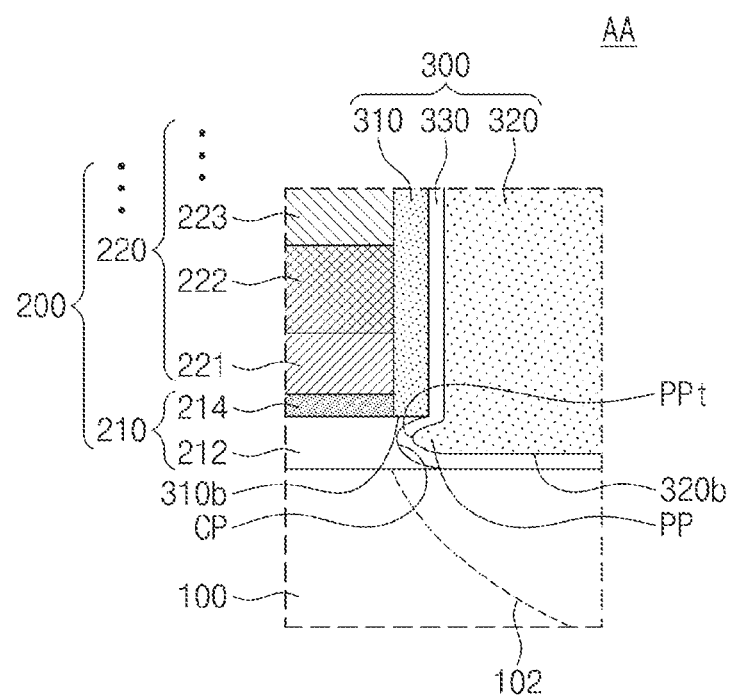
FIG. 4A is an enlarged sectional view further illustrating the portion 'AA' indicated in FIG. 3.
Figure 4B:
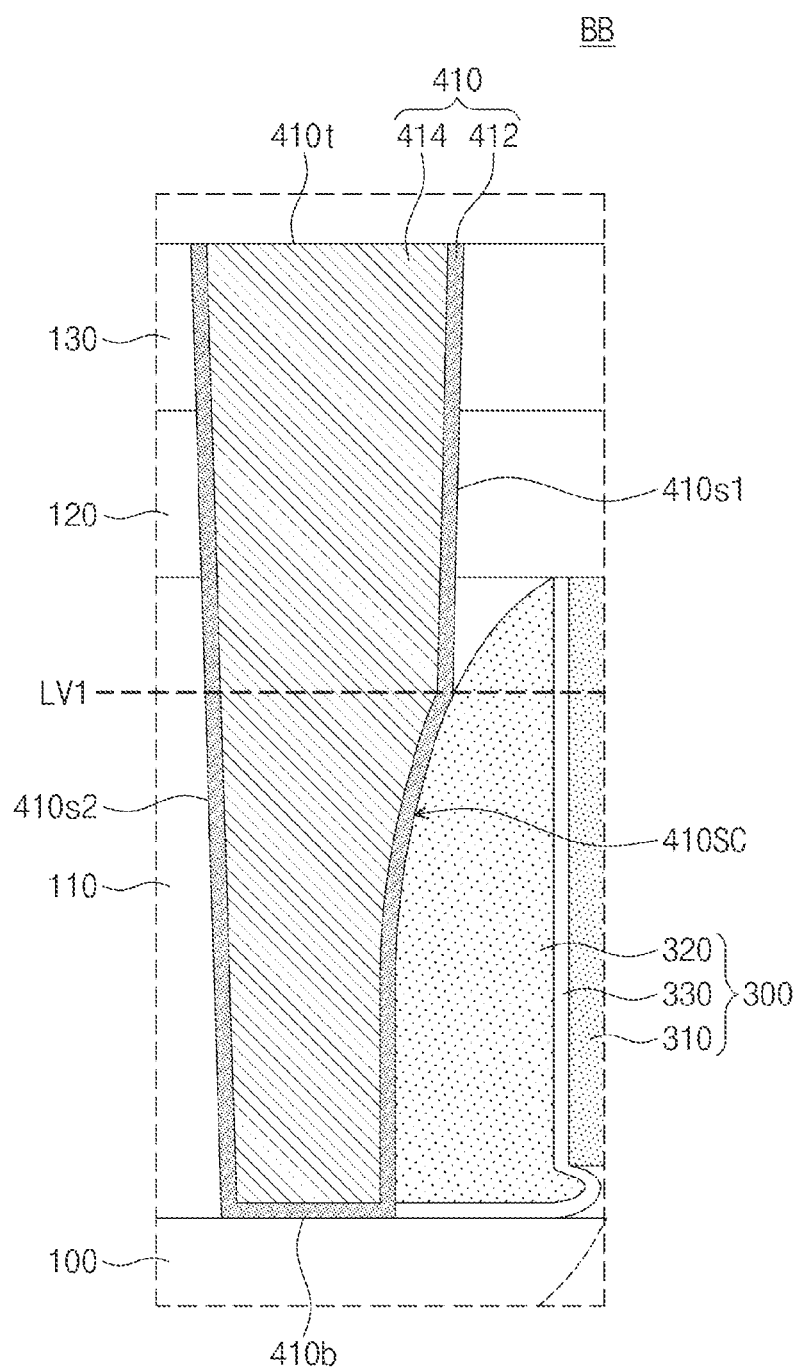
FIG. 4B is an enlarged sectional view further illustrating the portion 'BB' indicated in FIG. 3.

FIG. 2 is an enlarged plan view further illustrating a portion of the peripheral circuit region PR of a semiconductor device according to embodiments of the inventive concept. FIG. 3 is a sectional view taken along line A-A' in FIG. 2. FIG. 4A is an enlarged cross sectional view further illustrating the portion 'AA' indicated in FIG. 3, and FIG. 4B is an enlarged cross sectional view illustrating the portion 'BB' indicated in FIG. 3.

Referring to FIGS. 2 and 3, a gate stack 200 may be disposed on the peripheral circuit region PR of the substrate 100. The gate stack 200 may horizontally extend in a direction substantially parallel to an upper surface of the substrate 100. In some embodiments, the gate stack 200 may have a bar shape. The gate stack 200 may be disposed on a first active region A1, which is formed in an upper portion of the substrate 100. The first active region A1 may be an impurity region doped with N-type or P-type impurities and may be defined by a device isolation layer.

Impurity regions 102 may be formed in the upper portion of the substrate 100. The impurity regions 102 may be doped with impurities that is of a conductivity type different from the first active region A1. The impurity regions 102 may include a pair of source and drain regions, which are electrically connected to or disconnected from each other by voltages applied to the gate stack 200. A pair of the impurity regions 102 may be spaced apart from each other with the gate stack 200 interposed therebetween. The impurity regions 102 may be respectively disposed on opposite side surfaces 200s of the gate stack 200. In some embodiments, the gate stack 200 and the impurity regions 102 may constitute a P-type Metal Oxide Semiconductor (PMOS) transistor, and the impurity regions 102 may be P-type impurity regions. In this case, the impurity regions 102 may contain at least one of boron (B), aluminum (Al), gallium (Ga), and indium (In), for example. Alternately, the gate stack 200 and the impurity regions 102 may constitute an N-type Metal Oxide Semiconductor (NMOS) transistor, and the impurity regions 102 may be N-type impurity regions. In this case, the impurity regions 102 may contain at least one of phosphorus (P), arsenic (As), and antimony (Sb), for example.

Referring to FIGS. 3 and 4A, the gate stack 200 may include a gate insulating layer 210, a gate electrode 220, and a gate capping pattern 230. The gate insulating layer 210 may be interposed between the upper surface of the substrate 100 and the gate electrode 220. The gate capping pattern 230 may be disposed on an upper surface of the gate electrode 220.

The gate insulating layer 210 may include a first dielectric layer 212 and a second dielectric layer 214 on the first dielectric layer 212. The first dielectric layer 212 may have a dielectric constant that is lower than that of the second dielectric layer 214. For example, the dielectric constant of the first dielectric layer 212 may range from 3.5 to 4. The first dielectric layer 212 may include, for example, a silicon oxide layer and/or a silicon oxynitride layer. The second dielectric layer 214 may be a high-k dielectric layer whose dielectric constant is greater than the silicon oxide layer and/or the silicon oxynitride layer. The second dielectric layer 214 may be formed of (or include) at least one of oxides, nitrides, silicides, oxynitrides, or silicon oxynitride, which contain one of hafnium (Hf), aluminum (Al), zirconium (Zr), or lanthanum (La).

The first dielectric layer 212 may have a thickness (e.g., measured in a vertical direction substantially perpendicular to the upper surface of the substrate 100) greater than a thickness of the second dielectric layer 214. Additionally, a width (e.g., measured in the horizontal direction) of the first dielectric layer 212 may be greater than a width of the second dielectric layer 214. That is, the first dielectric layer 212 may be provided to cover an entire lower surface of the second dielectric layer 214, but a portion of an upper surface of the first dielectric layer 212 may not be covered with the second dielectric layer 214. The first dielectric layer 212 may have a side surface with a concave portion CP. The concave portion CP may be defined by the side surface of the first dielectric layer 212. That is, the concave portion CP may be a portion of the side surface of the first dielectric layer 212 which is inwardly recessed toward a center of the first dielectric layer 212. The concave portion CP may be disposed at a level between the upper and lower surfaces of the first dielectric layer 212. A width of the first dielectric layer 212 may have the minimum value at a level between the upper and lower surfaces of the first dielectric layer 212.

The concave portion CP may have a rounded inner side surface. That is, the inner side surface of the concave portion CP may have a continuously varying slope in a region from the lower surface of the first dielectric layer 212 to the upper surface of the first dielectric layer 212. The concave portion CP may be offset from the second dielectric layer 214. That is, the concave portion CP may not be vertically overlapped with the second dielectric layer 214. The concave portion CP may be vertically overlapped, at least in part, by a first spacer 310 disposed on a side surface of the second dielectric layer 214. The concave portion CP may be disposed between a lower surface 310b of the first spacer 310 and the upper surface of the substrate 100.

The gate electrode 220 may be disposed on the second dielectric layer 214. The gate electrode 220 may include a first conductive layer 221, a second conductive layer 222, a third conductive layer 223, an interface layer 225, and a fourth conductive layer 224—which are sequentially and vertically stacked on the substrate 100.

The first conductive layer 221 may be stacked on the second dielectric layer 214, and the second conductive layer 222 may be stacked on the first conductive layer 221. Each of the first and second conductive layers 221 and 222 may have a thickness greater than the second dielectric layer 214. The first and second conductive layers 221 and 222 may be work-function-adjusting layers, which are used to adjust a threshold voltage of a transistor. The first conductive layer 221 may be a P-type metal layer, and the second conductive layer 222 may be an N-type metal layer. For example, the first conductive layer 221 may be formed of (or include) at least one of Ti, Ta, Al, Ni, Co, La, Pd, Nb, Mo, Hf, Ir, Ru, Pt, Yb, Dy, Er, Pd, TiAl, HfSiMo, TiN, WN, TaN, RuN, MoN, TiAlN, TaC, TiC, or TaC. The second conductive layer 222 may further include at least one of, for example, La/TiN, Mg/TiN, or Sr/TiN layers. The element La in the second conductive layer 222 may be replaced with LaO or LaON. In some embodiments, the first conductive layer 221 may be omitted. In the case where the first conductive layer 221 is omitted, the thickness of the gate electrode 220 may be reduced by the thickness of the first conductive layer 221. The gate electrode 220, from which the first conductive layer 221 is omitted, may be used as a gate electrode of an NMOS transistor.

The third conductive layer 223 may be disposed on the second conductive layer 222. The third conductive layer 223 may have a thickness greater than each of the first and second conductive layers 221 and 222. The third conductive layer 223 may be a doped semiconductor layer. For example, the third conductive layer 223 may be a doped poly silicon layer. The third conductive layer 223 may be doped with P-type dopants.

The fourth conductive layer 224 may be disposed on the third conductive layer 223. The fourth conductive layer 224 may be formed of (or include) at least one of metallic materials. For example, the fourth conductive layer 224 may be formed of (or include) at least one of W, Ti, or Ta. The fourth conductive layer 224 may have a thickness greater than each of the first and second conductive layers 221 and 222.

The interface layer 225 may be formed between the third and fourth conductive layers 223 and 224. The interface layer 225 may include a silicide layer which is formed between the third and fourth conductive layers 223 and 224. For example, the interface layer 225 may be formed of (or include) at least one of titanium silicide, cobalt silicide, nickel silicide, tungsten silicide, platinum silicide, or molybdenum silicide.

The gate capping pattern 230 may be disposed on the upper surface of the gate electrode 220. The gate capping pattern 230 may be formed to cover the upper surface of the fourth conductive layer 224, and thus, the gate electrode 220 may be protected by the gate capping pattern 230. The gate capping pattern 230 may be formed of (or include) at least one of insulating materials. For example, the gate capping pattern 230 may be formed of (or include) silicon nitride.

A spacer structure 300 may be disposed on the side surfaces 200s of the gate stack 200. The spacer structure 300 may include the first spacer 310, a second spacer 320, and a third spacer 330.

The first spacer 310 may be formed on the side surface 200s of the gate stack 200. The first spacer 310 may be vertically extended along the side surfaces 200s of the gate stack 200. The first spacer 310 may have a lower portion disposed between the second dielectric layer 214 and the second spacer 320. The first spacer 310 may have an upper portion disposed between gate capping pattern 230 and the second spacer 320. The first spacer 310 may have an oxygen content ratio that is lower than the second spacer 320. The first spacer 310 may have a first dielectric constant which ranges from about 6.5 to about 7.5. The first spacer 310 may be formed of (or include) a material having an etch selectivity with respect to the first dielectric layer 212. For example, the first spacer 310 may be formed of (or include) silicon nitride.

The first spacer 310 may be provided to fully cover side surfaces of the gate electrode 220 and side surfaces of the gate capping pattern 230. An upper surface of the first spacer 310 may be substantially coplanar with an upper surface of the gate capping pattern 230. The first spacer 310 may be directly disposed on the side surface of the gate electrode 220 and the side surface of the gate capping pattern 230.

The first spacer 310 may be provided to at least partially cover side surfaces of the gate insulating layer 210. Referring to FIG. 4A, the first spacer 310 may be disposed on the upper surface of the first dielectric layer 212 to cover the side surface of the second dielectric layer 214. However, the side surface of the first dielectric layer 212 may not be covered with the first spacer 310. The first spacer 310 may cover the upper surface of the first dielectric layer 212. The lower surface 310b of the first spacer 310 may be disposed at a level (e.g., as measured in the vertical direction) higher than a protruding portion PP of the second spacer 320, which will be described below. The lower surface 310b of the first spacer 310 may be substantially coplanar with the lower surface of the second dielectric layer 214. The first spacer 310 may extend vertically while having a constant width. In some embodiments, a width of the first spacer 310 may be less than the thickness of the first dielectric layer 212 and greater than the thickness of the second dielectric layer 214.

Referring to FIGS. 3 and 4A, the second spacer 320 may be disposed on the first spacer 310. The second spacer 320 may have a width greater than the first spacer 310. The width of the second spacer 320 may decrease with increasing distance from the upper surface of the substrate 100. A lower surface 320b of the second spacer 320 may be disposed at a level lower than the upper surface of the first dielectric layer 212 and higher than the lower surface of the first dielectric layer 212.

The second spacer 320 may have an oxygen content ratio greater than that of the first spacer 310. The second spacer 320 may have a second dielectric constant lower than that of the first dielectric constant. In some embodiments, the second dielectric constant may range from about 3 to about 6. The second spacer 320 may be formed of (or include) a material containing silicon (Si), carbon (C), oxygen (O), and nitrogen (N). For example, the second spacer 320 may be formed of (or include) SIOCN. In some embodiments, a dielectric constant (i.e., the second dielectric constant) of the second spacer 320 may be greater than a dielectric constant of the first dielectric layer 212.

The third spacer 330 may be disposed between the first spacer 310 and the second spacer 320. The third spacer 330 may conformally cover the side surface of the first spacer 310. The third spacer 330 may be extended into a region below the lower surface 310*b* of the first spacer 310 to partially fill the concave portion CP of the first dielectric layer 212. The third spacer 330 may be provided to conformally cover an inner side surface of the concave portion CP. For example, the third spacer 330 may be in direct contact with the surface of the first dielectric layer 212 and may prevent a surface defect from occurring in the first dielectric layer 212. For example, the third spacer 330 may not include nitrogen (N) thereby preventing nitrogen atoms in the second spacer 320 from contacting the first dielectric layer 212. Accordingly, the third spacer 330 may improve a time-zero dielectric breakdown (TZDB) property, which is a short time reliability parameter. The third spacer 330 may be extended to the upper surface of the substrate 100 and may be interposed between the substrate 100 and the second spacer 320. The third spacer 330 may have a thickness less than that of the first spacer 310 and the second spacer 320. The third spacer 330 may have a third dielectric constant which is less than the first and second dielectric constants. For example, the third dielectric constant may range from about 3.5 to about 4.5. The third spacer 330 may be formed of (or include), for example, silicon oxide. In some embodiments, the second dielectric constant may be less than the third dielectric constant. The dielectric constant of the second spacer 320 (i.e., the second dielectric constant) will be described hereafter with reference to a method that may be used to form the second spacer 320.

The second spacer 320 may have the protruding portion PP disposed at a level lower the lower surface 310*b* of the first spacer 310 to protrude toward the first dielectric layer 212. The protruding portion PP may at least partially penetrate into the concave portion CP of the first dielectric layer 212. In some embodiments, the protruding portion PP may fill the remaining portion of the concave portion CP which is partially filled with the third spacer 330. The protruding portion PP may have a rounded shape. For example, a surface of the protruding portion PP, which is opposite to the first dielectric layer 212, may have a continuously varying slope in a region from the bottommost portion of the protruding portion PP to the uppermost portion. For example, the protruding portion PP may have a semi-circular section or a distorted or flattened circular section.

The protruding portion PP may be at least partially overlapped with the first spacer 310. In addition, the protruding portion PP may not be overlapped with the gate electrode 220. The protruding portion PP may have a tip PPt disposed below the lower surface 310*b* of the first spacer 310 and spaced apart from the side surface of the gate electrode 220 in the horizontal direction.

A first interlayer insulating layer 110 may be formed on the spacer structure 300. The first interlayer insulating layer 110 may cover the spacer structure 300. The first interlayer insulating layer 110 may cover the side surfaces of the spacer structure 300, but not the upper surface of the spacer structure 300. The first interlayer insulating layer 110 may have an upper surface disposed at the same level as an upper surface of the spacer structure 300 and an upper surface of the gate capping pattern 230. In some embodiments, The upper surface of the first interlayer insulating layer 110 may be substantially coplanar with the upper surface of the spacer structure 300 and the upper surface of the gate capping pattern 230. The first interlayer insulating layer 110 may include a high-density plasma (HDP) oxide layer or a silicon oxide layer formed by a flowable CVD (FCVD) method. A second interlayer insulating layer 120 and a third interlayer insulating layer 130 may be formed on the first interlayer insulating layer 110. A lower surface of the second interlayer insulating layer 120 may cover the upper surface of the gate capping pattern 230. In some embodiments, the second and third interlayer insulating layers 120 and 130 may be formed of (or include) the same material as the first interlayer insulating layer 110 and may be formed by the same method as the first interlayer insulating layer 110. The first, second, and third interlayer insulating layers 110, 120, and 130 may effectively constitute a single material layer without discernable interface.

Contact plugs 410 may be provided to penetrate the first, second, and third interlayer insulating layers 110, 120, and 130 to connect the impurity regions 102. The contact plug 410 may include a conductive pattern 414 and a barrier layer 412 on the conductive pattern 414. The conductive pattern 414 may be formed of (or include) at least one of metallic materials. For example, the conductive pattern 414 may be formed of (or include) at least one of copper (Cu), tungsten (W) and aluminum (Al), tantalum (Ta), or titanium (Ti). The barrier layer 412 may be formed of (or include) at least one of metal nitrides. For example, the barrier layer 412 may be formed of (or include) one of titanium nitride (TiN), tantalum nitride (TaN), and tungsten nitride (WN).

Referring to FIGS. 3 and 4B, the contact plug 410 may include a first side surface 410*s*1 adjacent to the spacer structure 300 and a second side surface 410*s*2 opposite to the first side surface 410*s*1. The first side surface 410*s*1 of the contact plug 410 may be in direct contact with the second spacer 320. The contact plug 410 may be extended along a side surface of the spacer structure 300 from an upper surface of the third interlayer insulating layer 130 to the upper surface of the substrate 100. Since the side surface of the spacer structure 300 has the curved shape, the first side surface 410*s*1 of the contact plug 410 may have a sunken region 410*sc* which is recessed toward the second side surface 410*s*2. Since the contact plug 410 has the sunken region 410*sc*, a distance between the contact plug 410 and the gate stack 200 may be increased. In this case, it may be possible to suppress an increase in an unintended capacitance between the contact plug 410 and the gate stack 200. That is, due to the sunken region 410*sc*, it may be possible to reduce a parasitic capacitance between the contact plug 410 and the gate stack 200. Also, in the case where the distance between the contact plug 410 and the gate stack 200 is increased, an electric field between the contact plug 410 and the gate stack 200 may be weakened, and this may make it possible to further improve reliability of the semiconductor device.

The contact plug 410 may have a width which decreases as it extends towards a lower surface 410*b* thereof. The width of the contact plug 410 may vary discontinuously at a first level LV1, which is a level of the highest point of an outer side surface of the second spacer 320 in contact with the contact plug 410. For example, the width of the contact plug 410 may decrease gradually from the upper surface of the third interlayer insulating layer 130 to the first level LV1. A change amount of the width of the contact plug 410 may increase as it goes from the upper surface of the substrate 100 to the first level LV1.

In some embodiments, the contact plug 410 may include a first portion, which is disposed below the first level LV1, and a second portion, which is disposed above the first level LV1. The first portion may have a horizontally asymmetric shape, and the second portion may have a horizontally symmetric shape.

In some embodiments, an angle between the upper surface of the substrate 100 and the second side surface 410s2 of the contact plug 410 may be substantially constant regardless of the vertical position from the upper surface of the substrate 100. In contrast, in a region below the first level LV1, an angle between the upper surface of the substrate 100 and the first side surface 410s1 of the contact plug 410 may vary depending on the vertical position from the upper surface of the substrate 100. The minimum value of the angle of the upper surface of the substrate 100 and the first side surface 410s1 of the contact plug 410 may be less than the minimum value of the angle between the upper surface of the substrate 100 and the second side surface 410s2. For example, the angle between the upper surface of the substrate 100 and the first side surface 410s1 of the contact plug 410 may have the minimum value at the first level LV1.

FIGS. 5A to 5F are related cross sectional views illustrating in one example a method of fabricating a peripheral circuit region of a semiconductor device according to embodiments of the inventive concept in relation to the embodiment illustrated in FIG. 2.

Figure 5A:
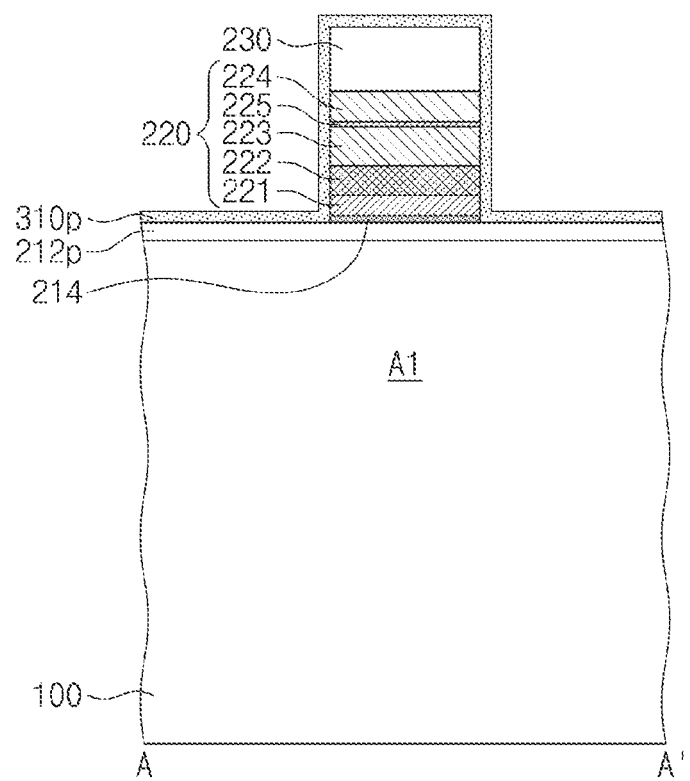
FIGS. 5A, 5B, 5C, 5D, 5E and 5F (collectively, "FIGS. 5A to 5F") are related cross sectional views illustrating in one example a method of fabricating a peripheral circuit region of a semiconductor device according to embodiments of the inventive concept.

Referring to FIG. 5A, a first preliminary dielectric layer 212p may be formed on the substrate 100. Next, the second dielectric layer 214, the gate electrode 220, and the gate capping pattern 230 may be formed on the first preliminary dielectric layer 212p. The formation of the first preliminary dielectric layer 212p, the second dielectric layer 214, the gate electrode 220, and the gate capping pattern 230 may be will be described in some additional detail hereafter with reference to a method of fabricating the cell region CR of the semiconductor device (e.g., see FIG. 1).

A first preliminary spacer layer 310p may be formed on an upper surface of the first preliminary dielectric layer 212p. The first preliminary spacer layer 310p may conformally cover the side surface of the second dielectric layer 214 and the side surface of the gate electrode 220. In addition, the first preliminary spacer layer 310p may conformally cover the side and upper surfaces of the gate capping pattern 230. The first preliminary spacer layer 310p may be formed by, for example, an atomic layer deposition (ALD) process.

Figure 5B:
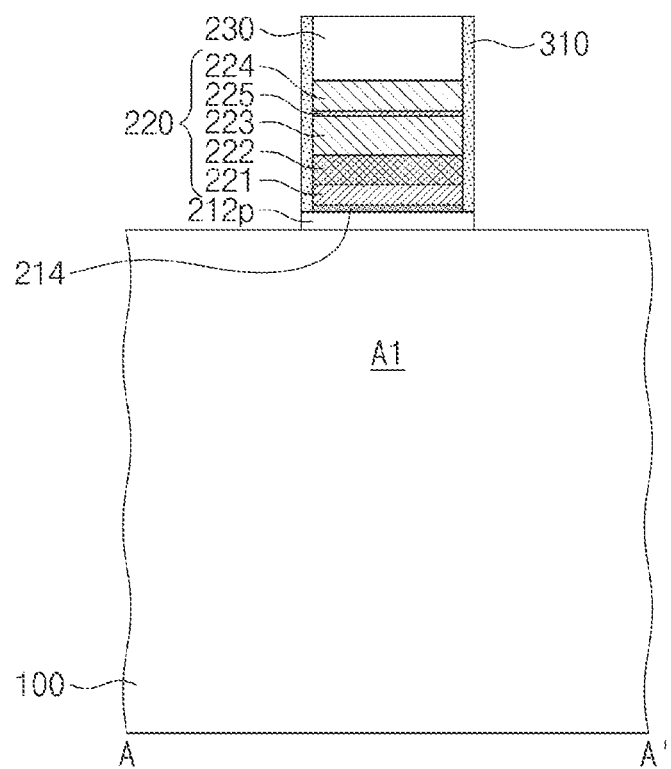

Referring to FIG. 5B, the first spacer 310 may be formed by partially removing the first preliminary spacer layer 310p. The partial removal of the first preliminary spacer layer 310p may be performed using an anisotropic etching process. As a result of the anisotropic etching process, the first preliminary spacer layer 310p may be removed from a region on the gate capping pattern 230 and from a region adjacent to the upper surface of the substrate 100. The first preliminary spacer layer 310p may not be removed from the side surfaces of the second dielectric layer 214, the gate electrode 220, and the gate capping pattern 230, and in this case, the remaining portion of the first preliminary spacer layer 310p may form the first spacer 310.

The anisotropic etching process may be performed to remove a portion of the first preliminary dielectric layer 212p around the gate electrode 220. For example, the first preliminary dielectric layer 212p below the gate electrode 220 and the first spacer 310 may not be removed by the anisotropic etching process. In some embodiments, as a result of the anisotropic etching process, the first preliminary dielectric layer 212p may have a side surface that is aligned to a side surface of the first spacer 310.

Figure 5C:
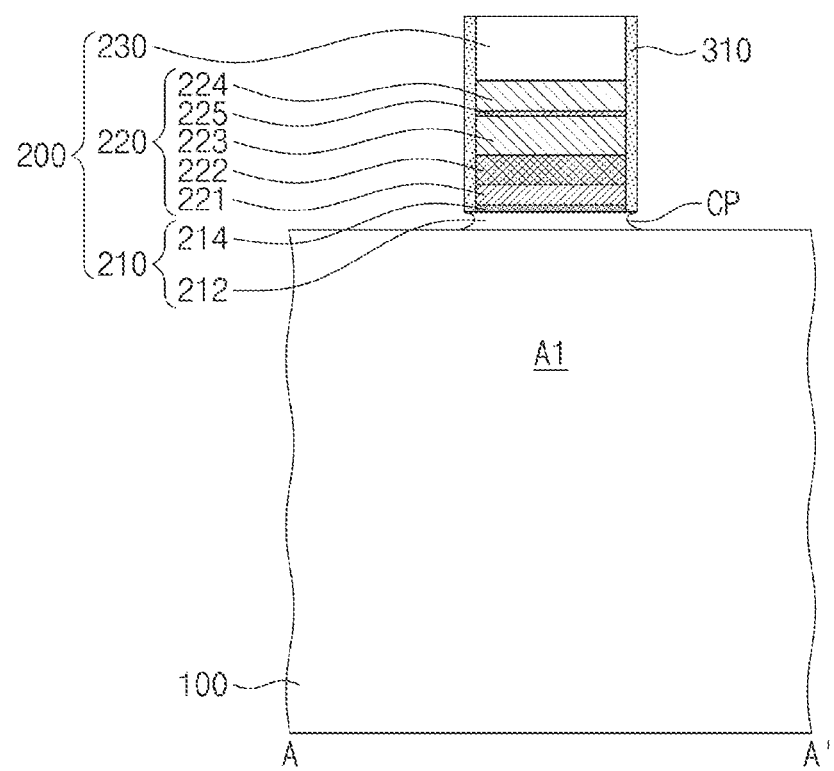

Referring to FIGS. 5B and 5C, the first dielectric layer 212 may be formed by forming the concave portion CP in the side surface of the first preliminary dielectric layer 212p. The formation of the concave portion CP may include partially removing the side surface of the first preliminary dielectric layer 212p. In some embodiments, the formation of the concave portion CP may include performing a cleaning process on the cell region CR of the substrate 100. In this case, native oxide layers, which are formed on the first active region A1, may be removed during the cleaning process. The cleaning process may include a plasma-based or dry cleaning process. In some embodiments, the plasma-based or dry cleaning process may be performed using, for example, a hydrogen gas. For example, in a plasma production apparatus, plasma or radicals may be produced from a process gas containing $H_2$ and $SiH_2$ and then may be used to clean the surfaces of the structures on the first active region A1. In some embodiments, the cleaning process may include a wet cleaning process. The surfaces of the structures on the first active region A1 may be cleaned in a wet manner. The wet cleaning process may be performed using, for example, HF solution.

Figure 5D:
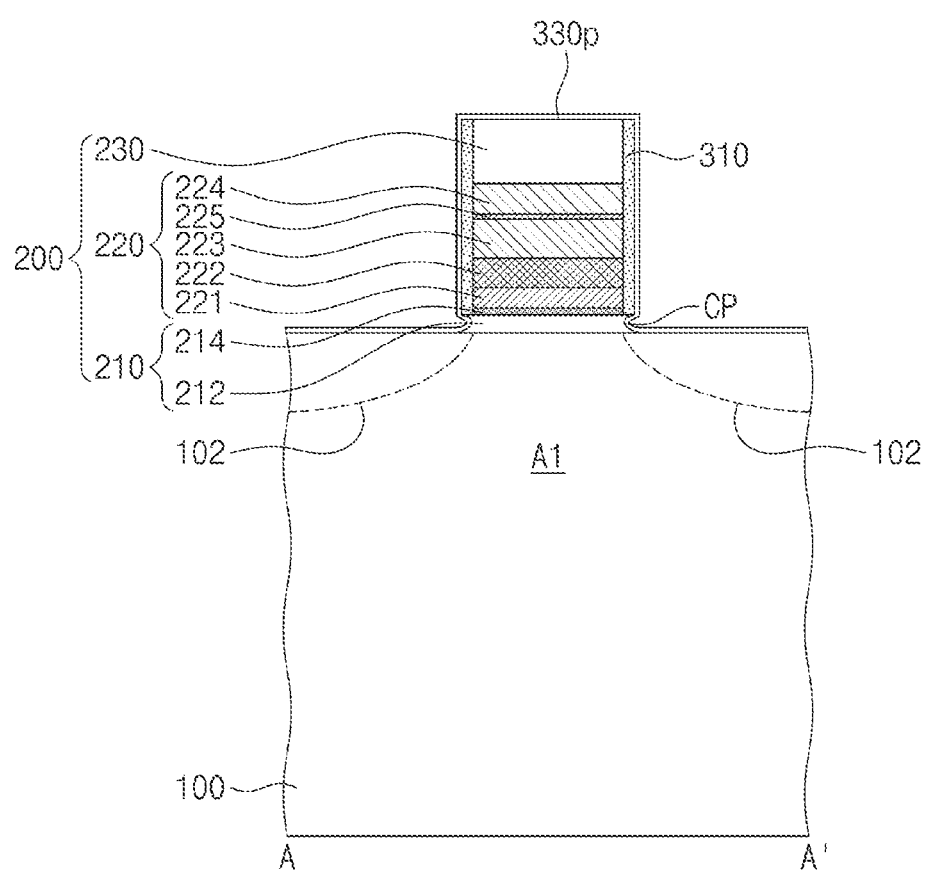

Referring to FIG. 5D, the impurity regions 102 may be formed in upper portions of the first active region A1, which are not covered with the gate stack 200 and the first spacer 310. In some embodiments, the impurity regions 102 may be formed by an ion implantation process. Next, a third preliminary spacer layer 330p may be formed to cover or enclose the gate stack 200 and the first spacer 310. The third preliminary spacer layer 330p may conformally cover the upper surface of the substrate 100, the upper surface of the first dielectric layer 212, the side surface of the first spacer 310, and the upper surface of the gate capping pattern 230. The third preliminary spacer layer 330p may partially fill the concave portion CP on the side surface of the first dielectric layer 212. The third preliminary spacer layer 330p may conformally cover the inner side surface of the concave portion CP.

Figure 5E:
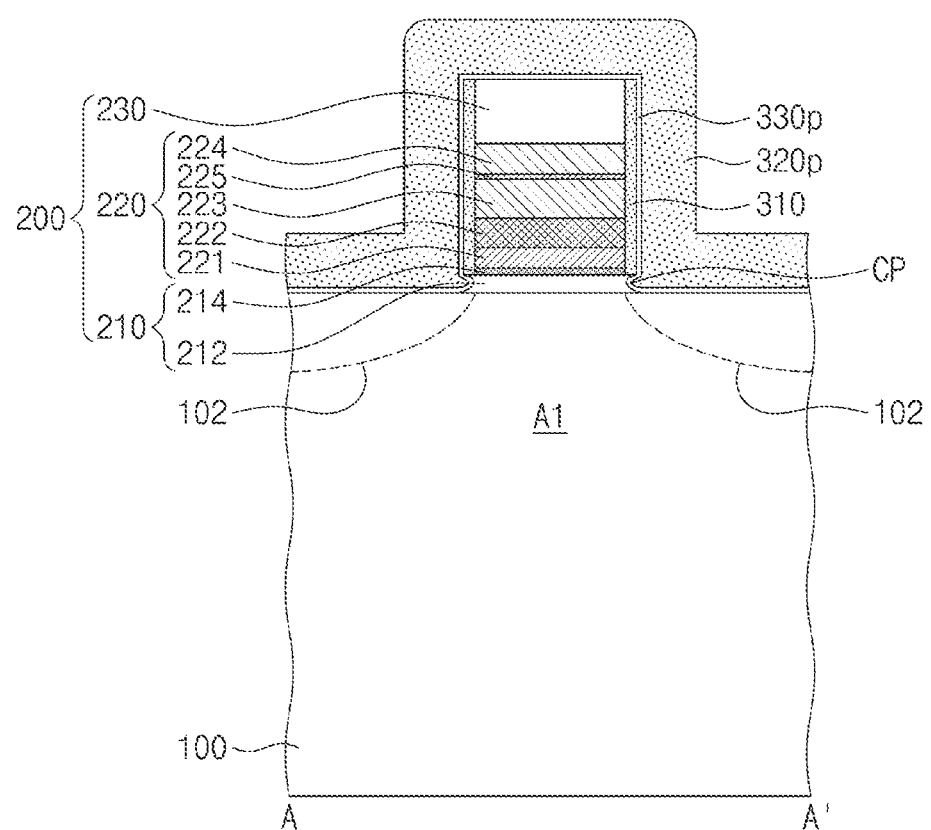

Referring to FIG. 5E, a second preliminary spacer layer 320p may be formed on the third preliminary spacer layer 330p. The second preliminary spacer layer 320p may be formed to be thicker than the third preliminary spacer layer 330p and may be formed to fully fill the remaining portion of the concave portion CP which is partially filled with the third preliminary spacer layer 330p. The second preliminary spacer layer 320p may be formed of (or include), for example, SIOCN. The second preliminary spacer layer 320p may be formed by a plasma-enhanced atomic layer deposition (PEALD) process. During the PEALD process, content ratios of oxygen, carbon, and nitrogen in the second preliminary spacer layer 320p may be controlled to realize a low dielectric constant of the second preliminary spacer layer 320p. For example, the dielectric constant of the second preliminary spacer layer 320p may be controlled to have a value ranging from 3 to 6.

Figure 5F:
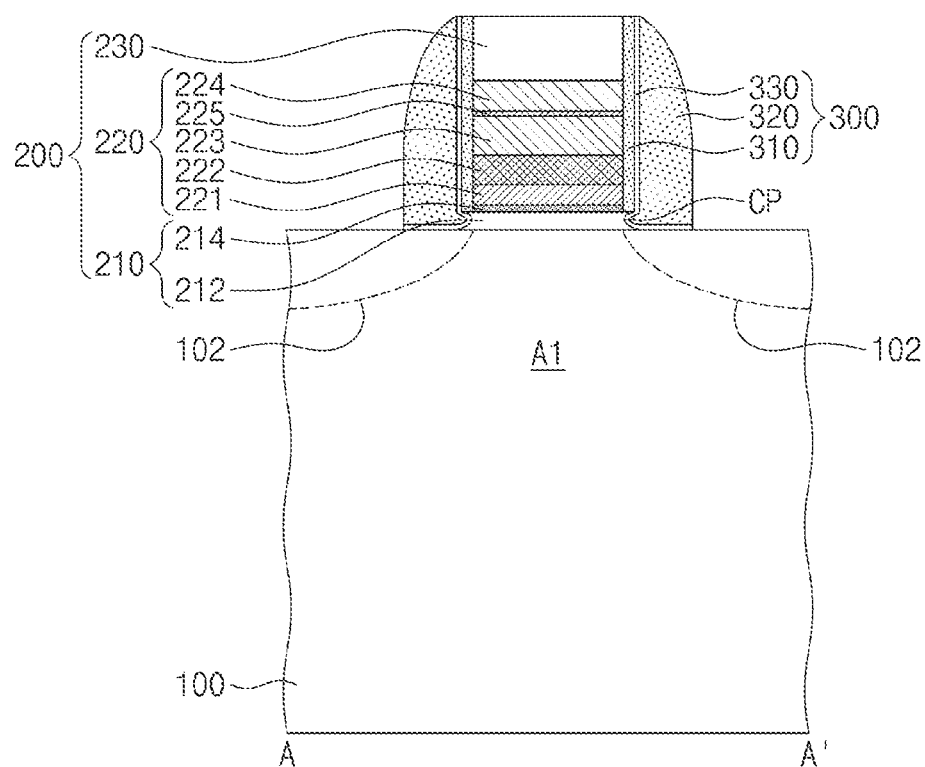

Referring to FIGS. 5E and 5F, the second and third preliminary spacer layers 320p and 330p may be anisotropically etched to form the spacer structure 300. Horizontally-extended portions of the second and third preliminary spacer layers 320p and 330p, which are disposed on the upper surface of the substrate 100, may be removed by the anisotropic etching process. Similarly, portions of the second and third preliminary spacer layers 320p and 330p disposed on the upper surface of the gate capping pattern 230 may be removed by the anisotropic etching process. The first, second, and third spacers 310, 320, and 330 may have vertically aligned side surfaces and substantially coplanar upper surfaces.

Figure 6A:
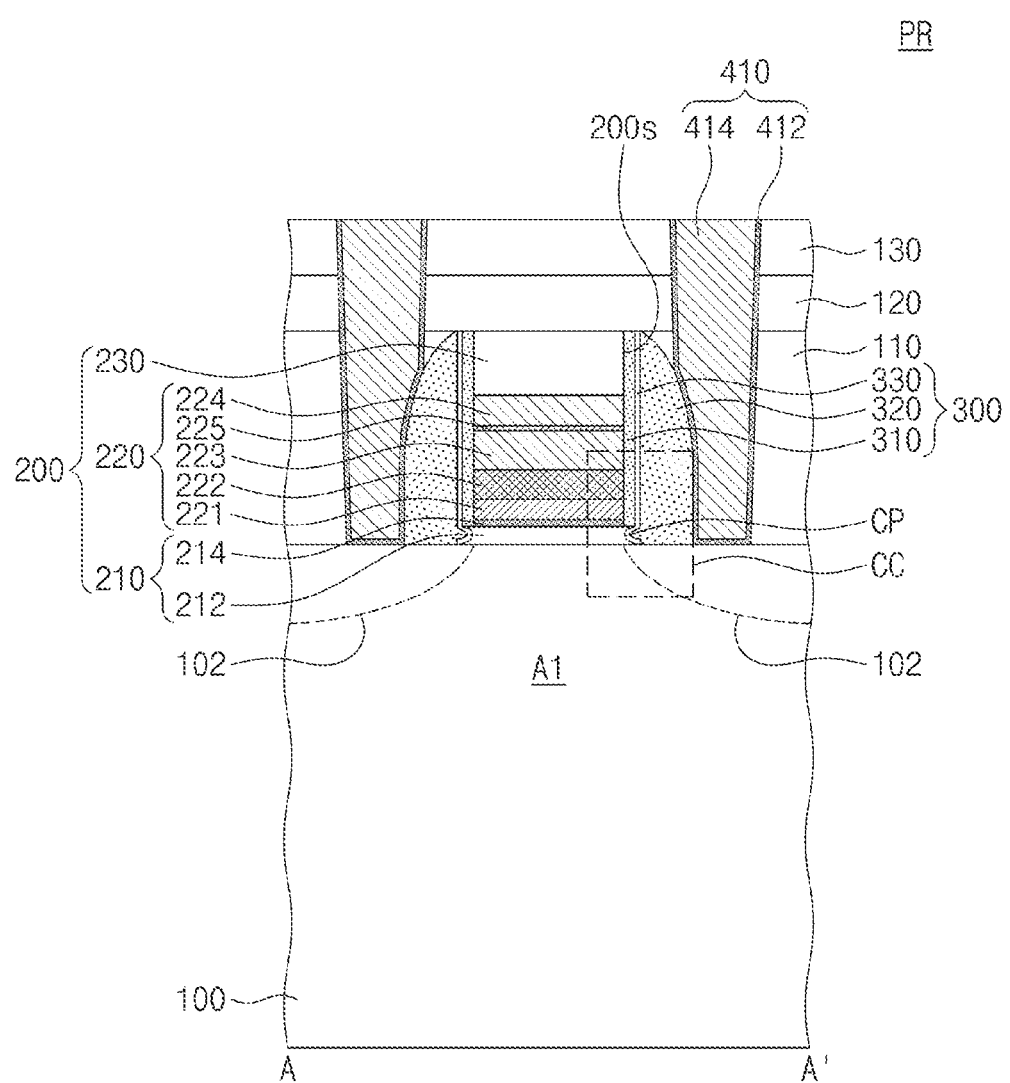
FIGS. 6A and 7A are cross sectional views illustrating a semiconductor device according to embodiments of the inventive concept.
Figure 6B:
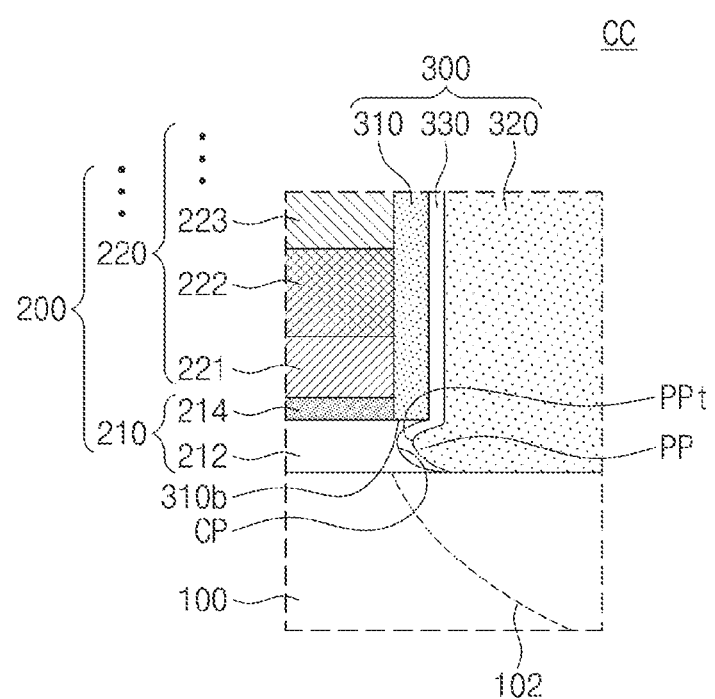
FIG. 6B is an enlarged sectional view of the portion 'CC' indicated in FIG. 6A.
Figure 7A:
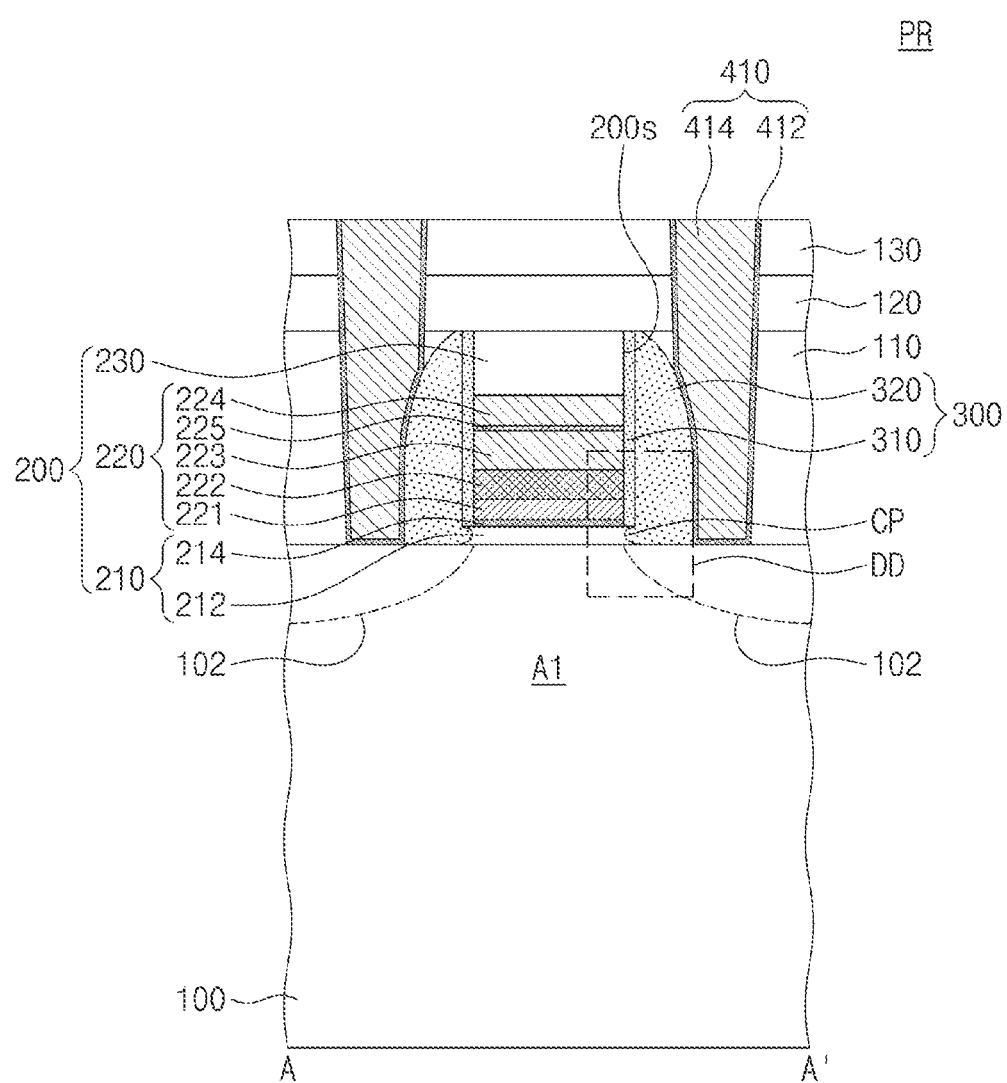

FIGS. 6A and 7A are respective cross sectional views illustrating a semiconductor device according to embodiments of the inventive concept. FIG. 6B is an enlarged sectional view further illustrating the portion 'CC' indicated in FIG. 6A, and FIG. 7B is an enlarged sectional view illustrating portion 'DD' indicated in FIG. 7A.

Referring to FIGS. 6A and 6B, the third spacer 330 may be disposed between the second spacer 320 and the first spacer 310 and between the second spacer 320 and the first dielectric layer 212. The third spacer 330 may not be provided between the upper surface of the substrate 100 and the second spacer 320. Accordingly, the second spacer 320 may be in contact with the upper surface of the substrate 100. The second spacer 320 may have a lower surface which is disposed at the same level as the lower surface of the first dielectric layer 212 and the bottom of the third spacer 330.

Figure 7B:
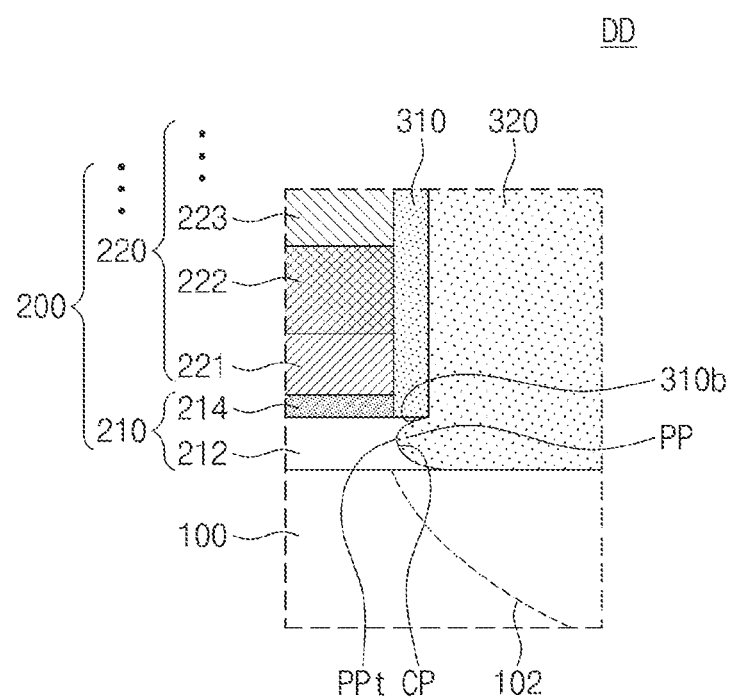
FIG. 7B is an enlarged sectional view of the portion 'DD' of FIG. 7A.

Referring to FIGS. 7A and 7B, the second spacer 320 may be in direct contact with the first spacer 310 and the first dielectric layer 212. That is, the third spacer 330 described with reference to FIG. 3 may be omitted from the semiconductor device according to the present embodiment. The concave portion CP of the first dielectric layer 212 may be filled with only the second spacer 320. The protruding portion PP of the second spacer 320 may be in direct contact with the inner side surface of the concave portion CP. A thickness of the protruding portion PP of the second spacer 320 may be substantially equal to a thickness of the first dielectric layer 212.

Portions of the description that follow refer to a method of forming a semiconductor device on a cell region and a peripheral circuit region according to embodiments of the inventive concept.

Figure 8:
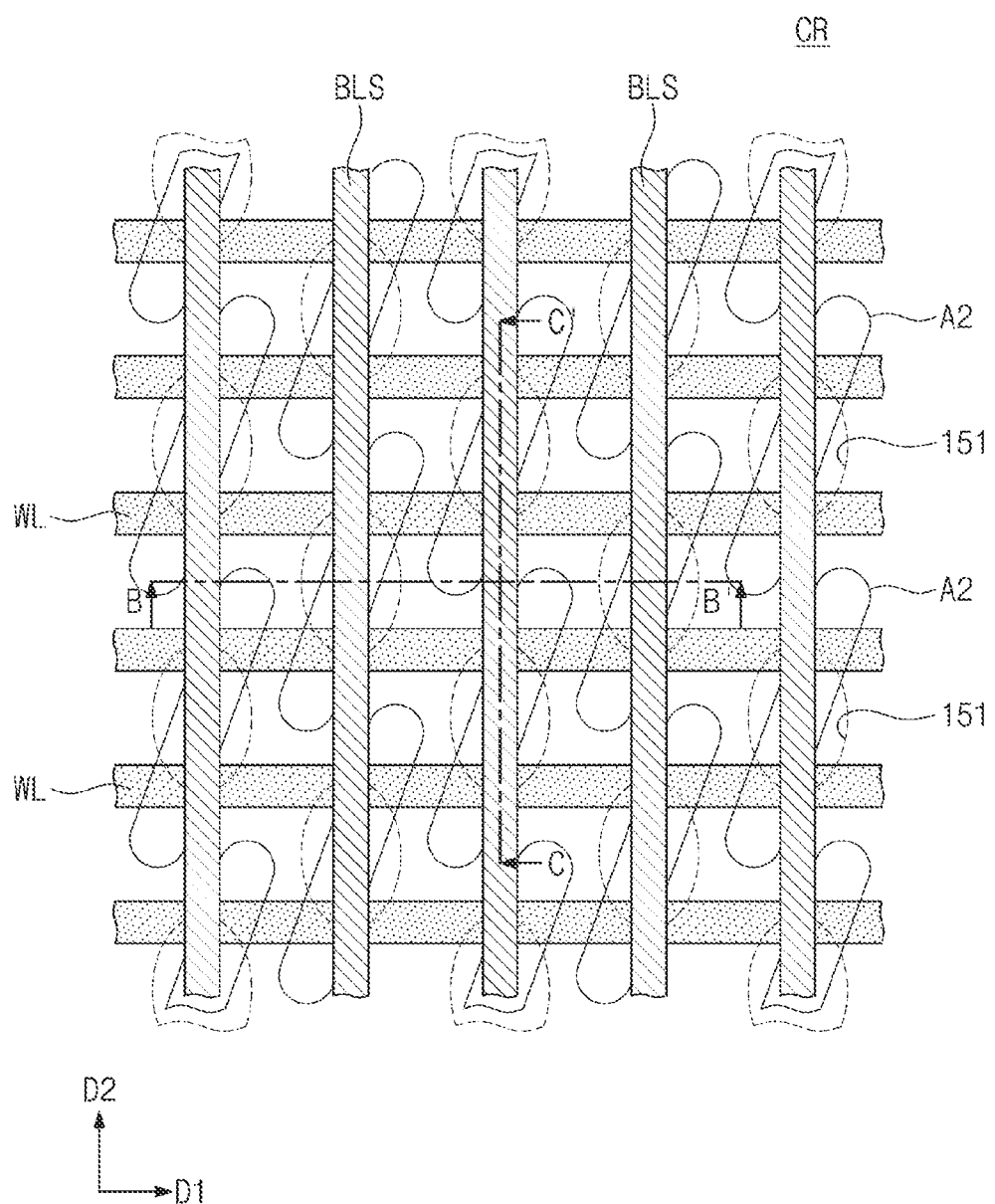
FIG. 8 is a plan view illustrating a cell region of a semiconductor device according to embodiments of the inventive concept.
Figure 9A:
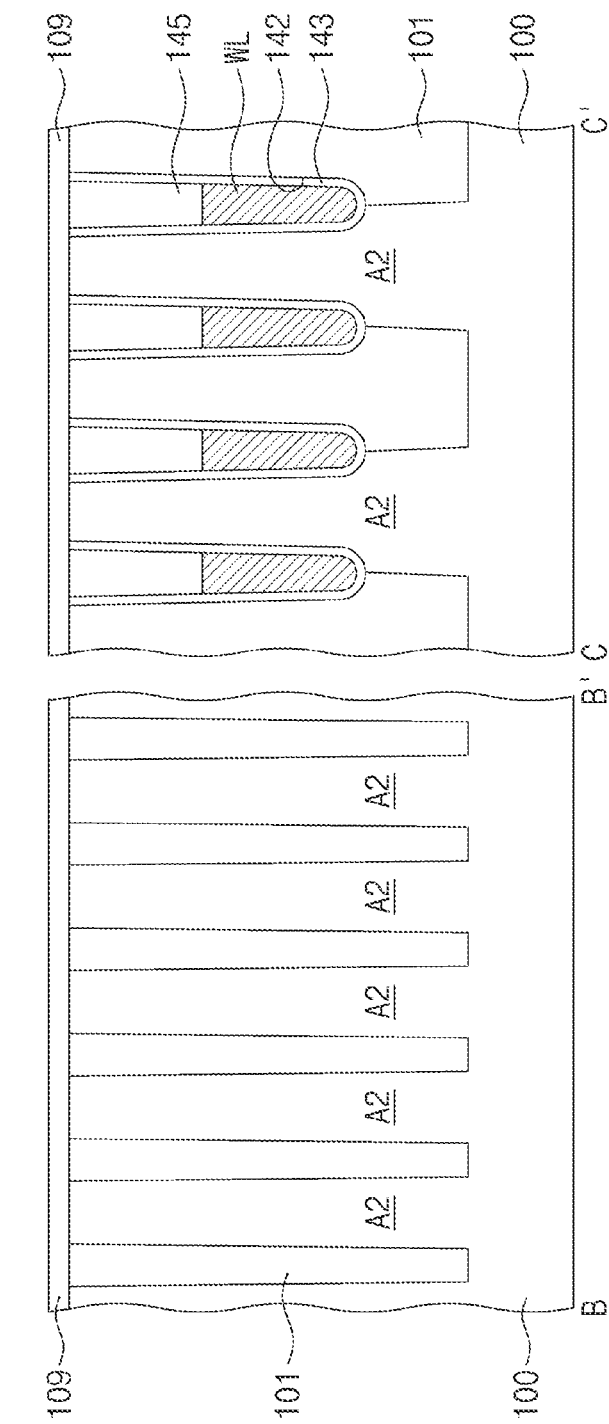
FIGS. 9A, 10A, 11A, 12A, 13A, 14A and 15A (collectively, "FIGS. 9A to 15A") are respective cross sectional views illustrating a method of fabricating a semiconductor device in relation an embodiment of the inventive concept corresponding to lines B-B' and C-C' of FIG. 8.
Figure 9B:
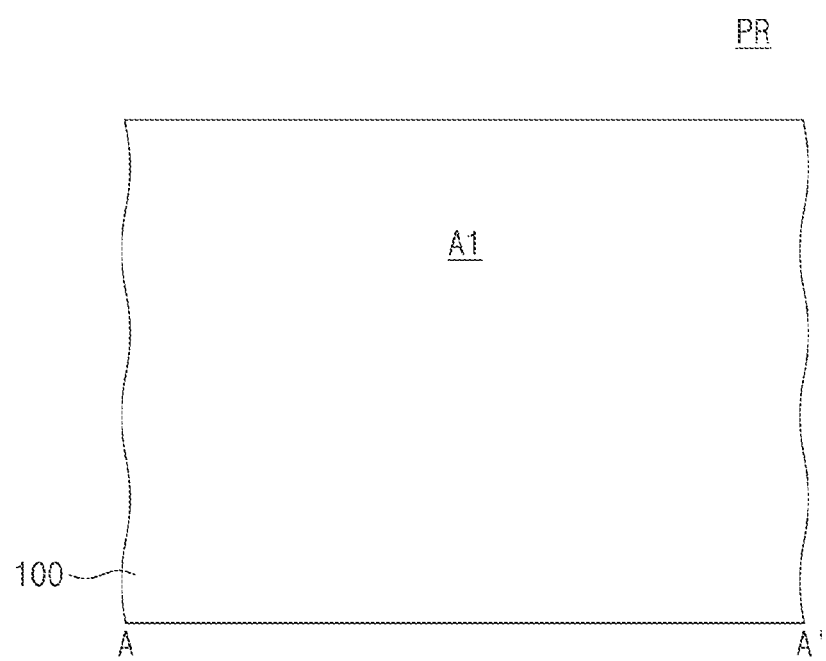
FIGS. 9B, 10B, 11B, 12B, 13B, 14B and 15B (collectively, "FIGS. 9B to 15B") are respective cross sectional views illustrating a method of fabricating a semiconductor device in relation to an embodiment of the inventive concept corresponding to the line A-A' of FIG. 2.

FIG. 8 is a plan view illustrating a cell region of a semiconductor device according to embodiments of the inventive concept. FIG. 9A to 15A are cross sectional views illustrating in one example a method of fabricating a semiconductor device according to embodiments of the inventive concept in relation to the embodiment illustrated in FIG. 8. FIG. 9B to 15B are cross sectional views illustrating in one example a method of fabricating a semiconductor device according to embodiments of the inventive concept in relation to the embodiments illustrated in FIG. 2.

Referring to FIGS. 2, 8, 9A, and 9B, a device isolation layer 101 may be formed in the cell region CR of the substrate 100 to define a second active region A2. In some embodiments, the semiconductor device may be a DRAM device, and the cell region CR of the substrate 100 may be a memory cell region of the DRAM device. In some embodiments, a mask may be formed on the peripheral circuit region PR to protect the peripheral circuit region PR, before the formation of the device isolation layer 101. The device isolation layer 101 may be formed by forming trenches in an upper portion of the substrate 100 and filling the trenches with an insulating material. The second active regions A2 may be two-dimensionally (or horizontally) arranged in a first direction D1 and a second direction D2. Each of the second active regions A2 may have, for example, a rectangular or bar shape. The second active regions A2 may be arranged in a zigzag shape, when viewed in a plan view, and may have a long axis that is oblique to the first and second directions D1 and D2.

Word lines WL extending in the first direction D1 may be formed on the cell region CR of the substrate 100. First, the second active region A2 and the device isolation layer 101 may be patterned to form gate recess regions 142 extending in the first direction D1. The word lines WL may be formed in lower portions of the gate recess regions 142, and a cell gate insulating layer 143 may be interposed between the word lines WL and the gate recess regions 142. The gate recess regions 142 may be formed to have lower surfaces disposed at a higher level than a lower surface of the device isolation layer 101. The word lines WL may have upper surfaces disposed at a level lower than an upper surface of the device isolation layer 101. Gate hard mask patterns 145 may be formed in the gate recess regions 142, in which the word lines WL are formed.

After the formation of the word lines WL, cell impurity regions may be formed in the second active regions A2 and at both sides of the word lines WL. The cell impurity regions may be formed in upper portions of the second active regions A2. The cell impurity regions may be formed by an ion implantation process and may have a conductivity type which is different from the second active region A2.

A buffer layer 109 may be formed on the substrate 100. The buffer layer 109 may be a single layer or multiple insulating layers. For example, the buffer layer 109 may include a silicon oxide layer, a silicon nitride layer, and/or a silicon oxynitride layer.

Figure 10A:
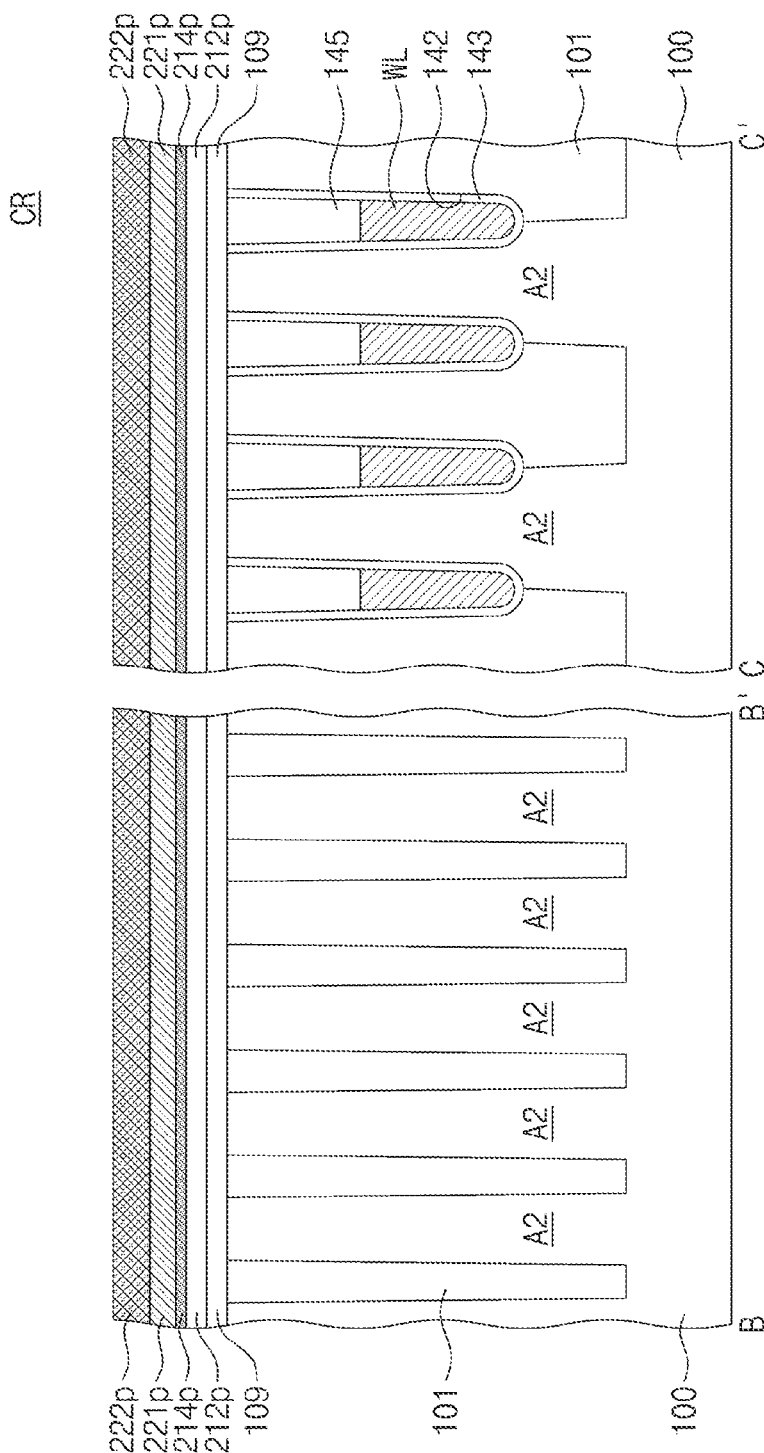
Figure 10B:
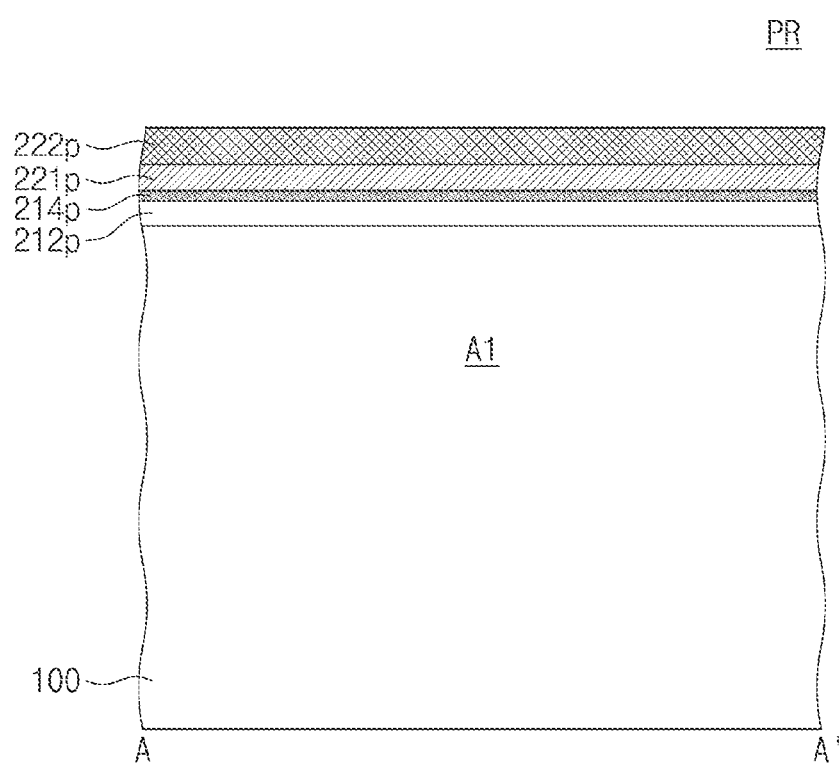

Referring to FIGS. 10A and 10B, the first preliminary dielectric layer 212p and a second preliminary dielectric layer 214p may be formed on the cell region CR and the peripheral circuit region PR of the substrate 100. The first preliminary dielectric layer 212p may have a dielectric constant less than the second preliminary dielectric layer 214p. For example, the first preliminary dielectric layer 212p may include a silicon oxide layer and/or a silicon oxynitride layer. The first preliminary dielectric layer 212p may be thicker than the second preliminary dielectric layer 214p. The second preliminary dielectric layer 214p may be a high-k dielectric layer having a dielectric constant greater than that of the silicon oxide layer. For example, the second preliminary dielectric layer 214p may be formed of (or include) at least one of oxides, nitrides, silicides, oxynitrides, or silicon oxynitride, which contain one of hafnium (Hf), aluminum (Al), zirconium (Zr), or lanthanum (La). The first and second preliminary dielectric layers 212p and 214p may be formed using one of ALD, Chemical Vapor Deposition (CVD), and Physical Vapor Deposition (PVD) processes.

A first preliminary conductive layer 221p and a second preliminary conductive layer 222p may be formed on the second preliminary dielectric layer 214p. The first preliminary conductive layer 221p and the second preliminary conductive layer 222p may be formed using an ALD or PVD process.

Figure 11A:
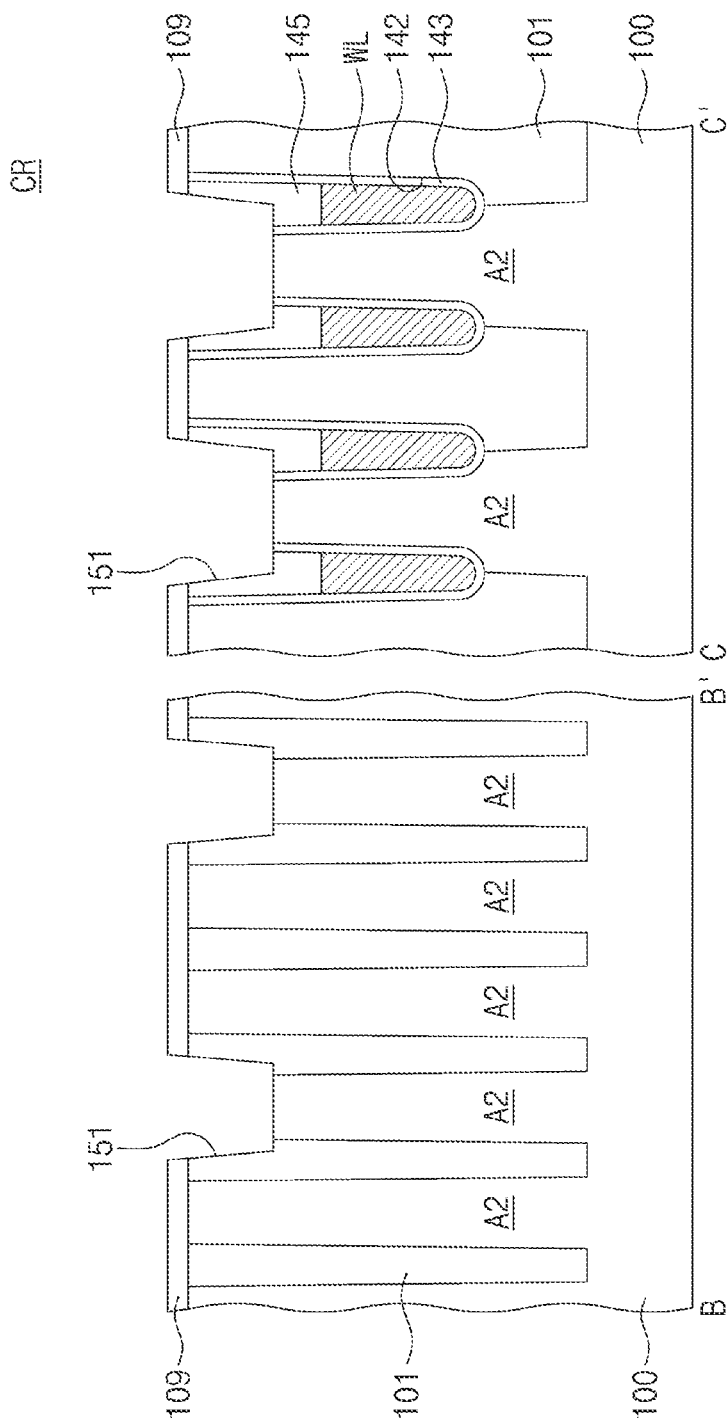
Figure 11B:
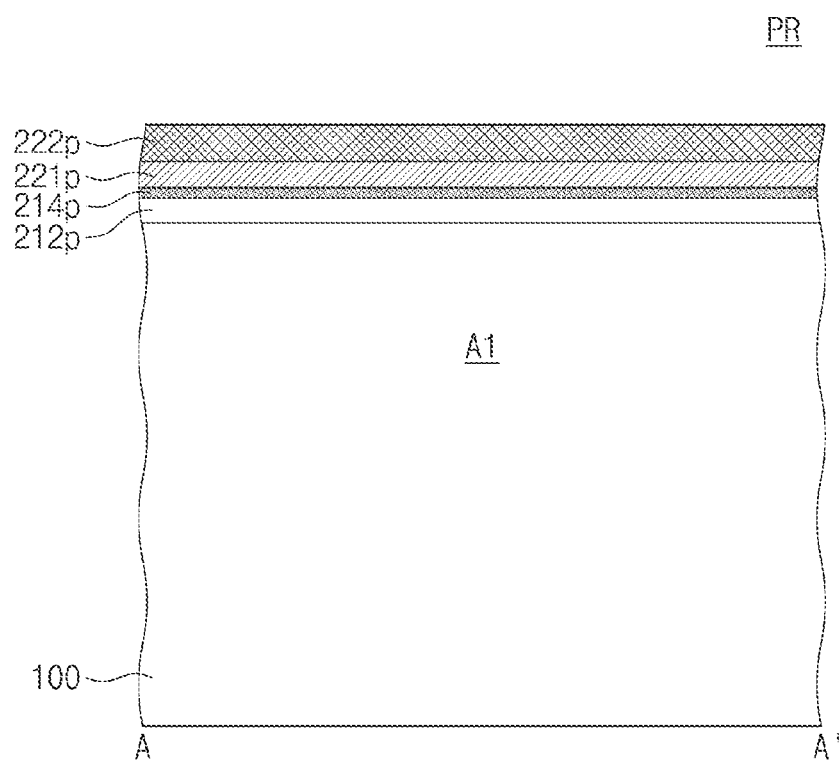

Referring to FIGS. 11A and 11B, a mask may be formed on the peripheral circuit region PR to veil the peripheral circuit region PR, and then, the first and second preliminary dielectric layers 212p and 214p and the first and second preliminary conductive layers 221p and 222p may be removed from the cell region CR.

Thereafter, the substrate 100 and the buffer layer 109 may be patterned to form recess regions 151 exposing the cell impurity regions, respectively. For example, each of the recess regions 151 may have an elliptical shape, when viewed in a plan view. In addition, the recess regions 151 may be arranged in a zigzag or honeycomb shape, when viewed in a plan view. The recess regions 151 may be formed by an anisotropic etching process, and in this case, the device isolation layer 101, the cell gate insulating layer 143, and the gate hard mask patterns 145, which are adjacent to the cell impurity regions, may also be partially etched during the anisotropic etching process.

Figure 12A:
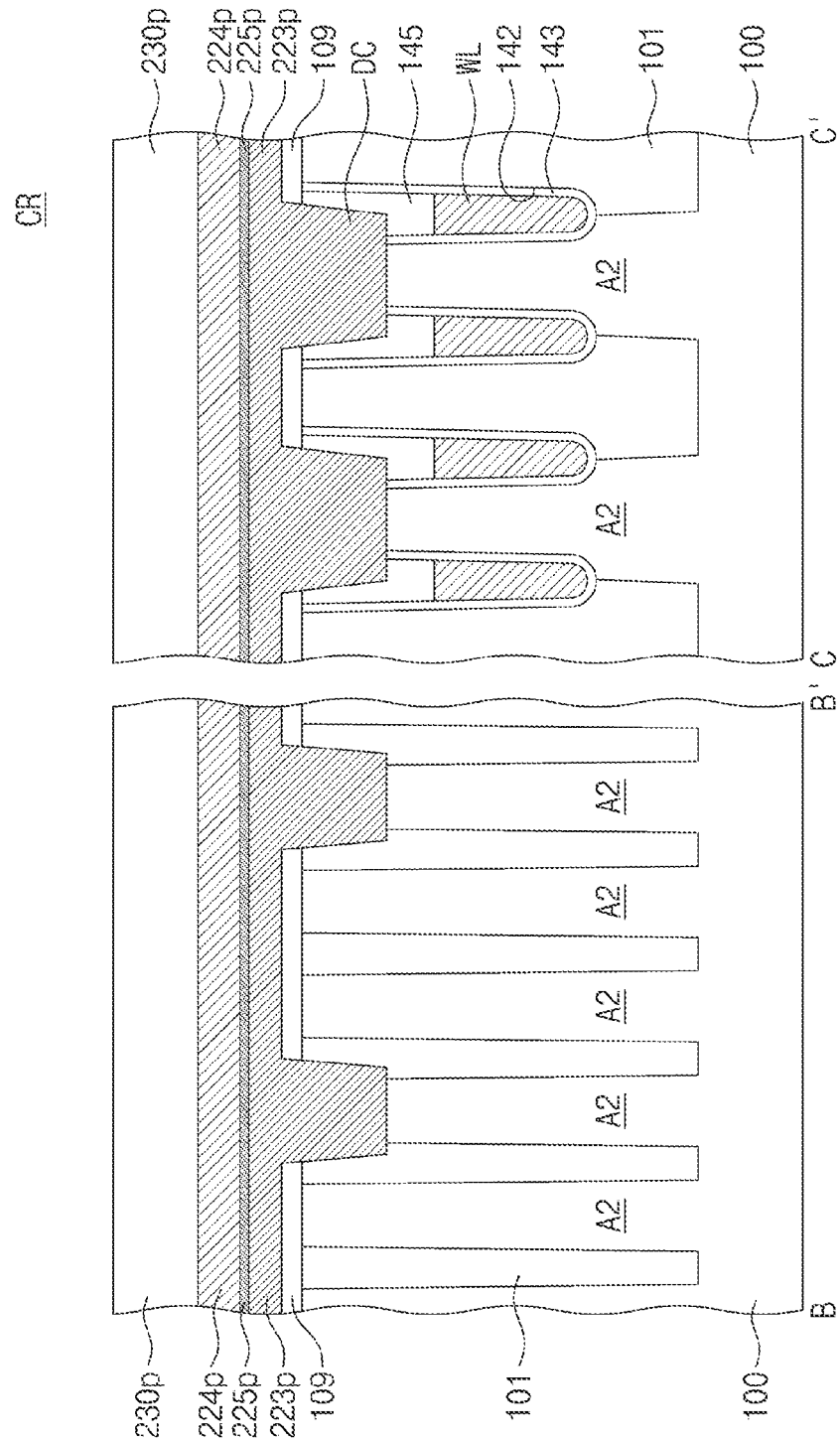
Figure 12B:
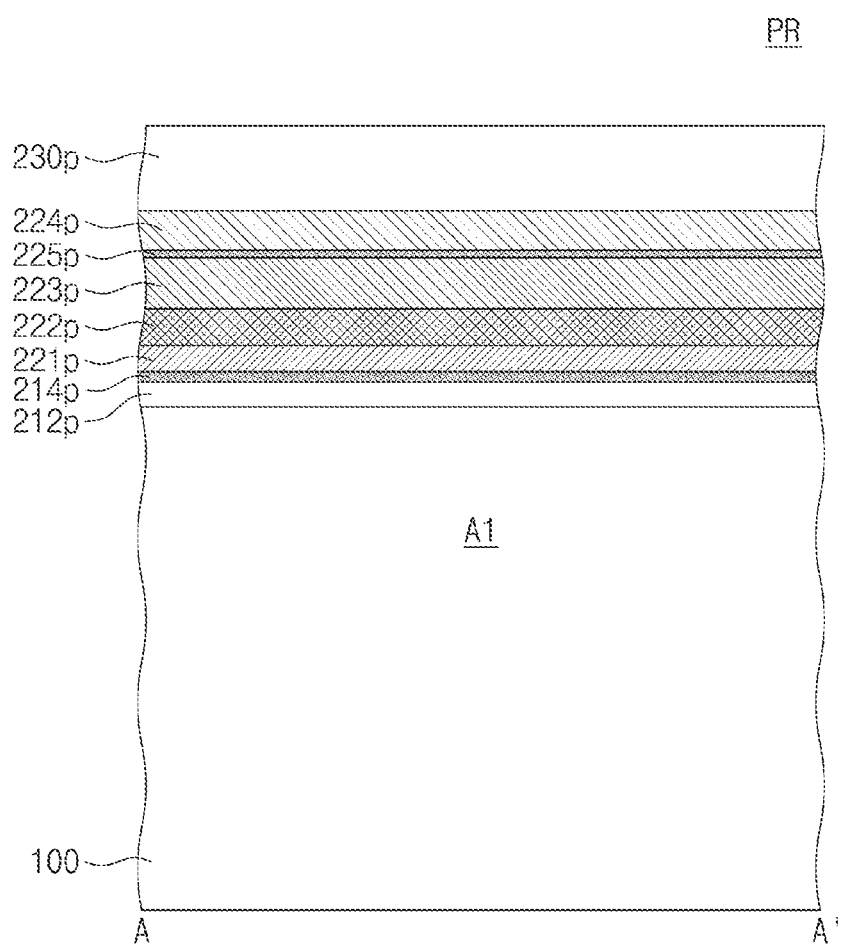

Referring to FIGS. 12A and 12B, a first contact DC may be formed to fill the recess regions 151. Next, a third preliminary conductive layer 223p, a preliminary interface layer 225p, and a fourth preliminary conductive layer 224p may be formed on the cell region CR and the peripheral circuit region PR of the substrate 100. The third preliminary conductive layer 223p and the fourth preliminary conductive layer 224p may be formed by an ALD or PVD process. The preliminary interface layer 225p may include a silicide layer, which is formed by a reaction between a metal material and an upper surface of the third preliminary conductive layer 223p. A preliminary capping pattern 230p may be formed on the fourth preliminary conductive layer 224p. The preliminary capping pattern 230p may be formed using one of ALD, CVD, and PVD processes.

Figure 13A:
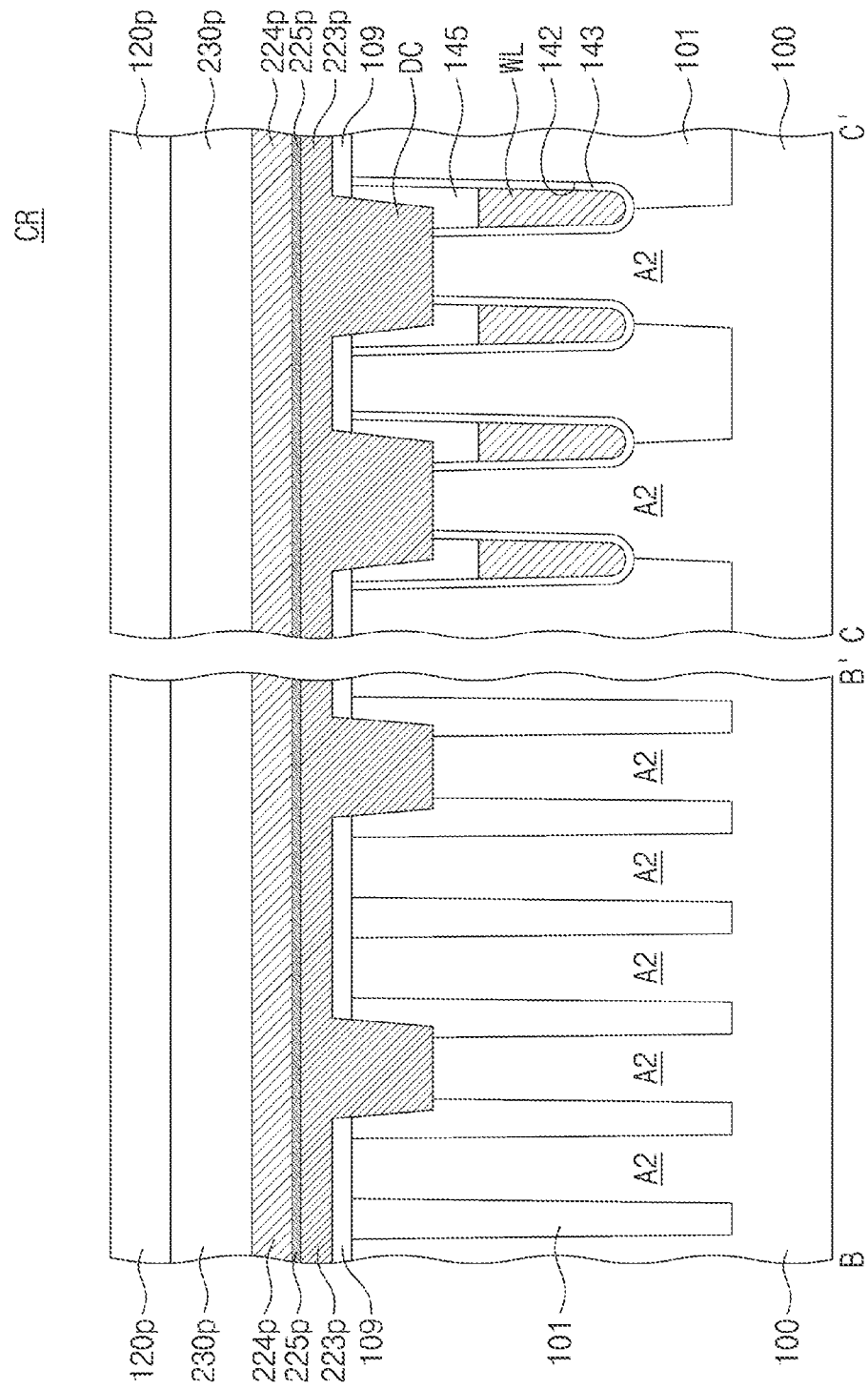
Figure 13B:
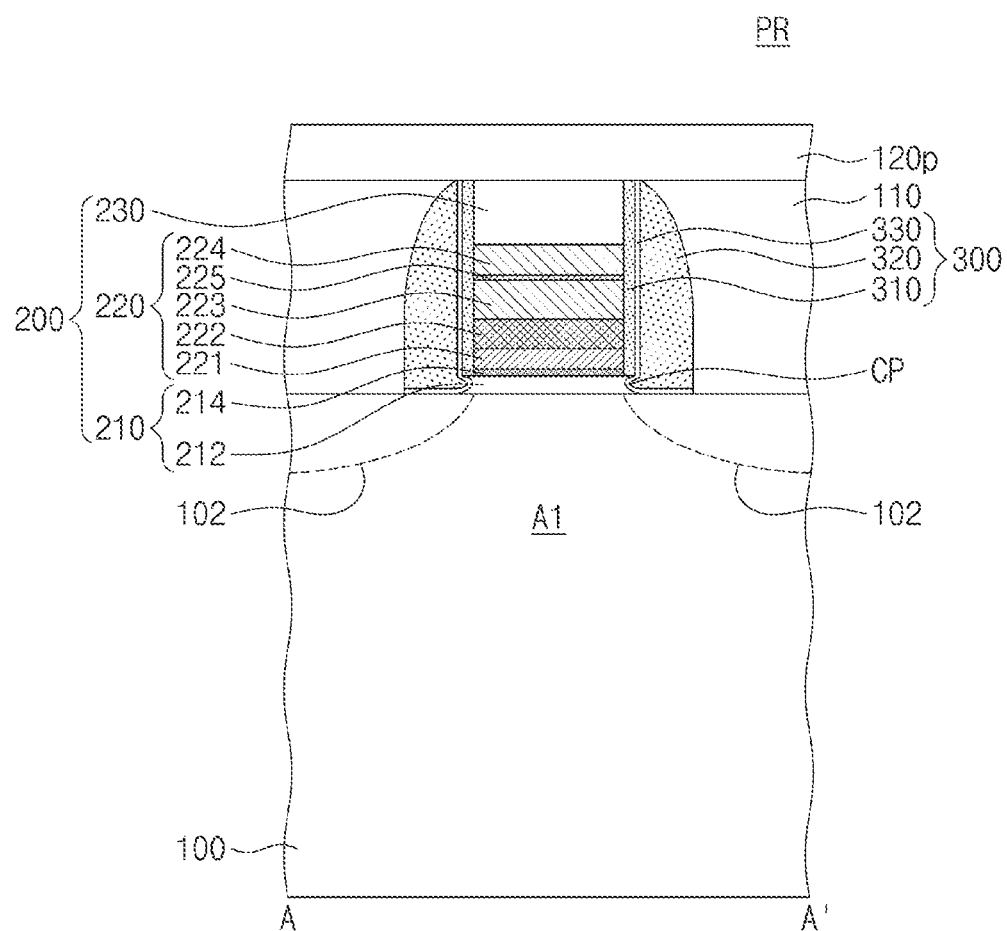

Referring to FIGS. 13A and 13B, a mask may be formed on the cell region CR to veil the cell region CR, and then, the gate stack 200 and the spacer structure 300 may be formed on the peripheral circuit region PR. The first and second preliminary dielectric layers 212p and 214p on the peripheral circuit region PR may be patterned to form the gate insulating layer 210. The first preliminary conductive layer 221p, the second preliminary conductive layer 222p, the third preliminary conductive layer 223p, the preliminary interface layer 225p and the fourth preliminary conductive layer 224p may be patterned to form the gate electrode 220. The preliminary capping pattern 230p may be patterned to form the gate capping pattern 230. The gate insulating layer 210, the gate electrode 220, and the gate capping pattern 230 may constitute the gate stack 200. The impurity regions 102 may be formed in upper portions of the first active region A1 near the gate stack 200. The spacer structure 300 may be formed on a side surface of the gate stack 200. The gate stack 200 and the spacer structure 300 may be formed by the same method as described with reference to FIGS. 5A to 5F.

Thereafter, the first interlayer insulating layer 110 may be formed on the peripheral circuit region PR of the substrate 100 to cover the side surfaces of the spacer structure 300. Next, the mask covering the cell region CR may be removed, and a second preliminary interlayer insulating layer 120p may be formed on the substrate 100 to cover not only the cell region CR but also the peripheral circuit region PR. At least one of the first interlayer insulating layer 110 and the second preliminary interlayer insulating layer 120p may include a high-density plasma (HDP) oxide layer or a silicon oxide layer formed by a flowable CVD (FCVD) method.

Figure 14A:
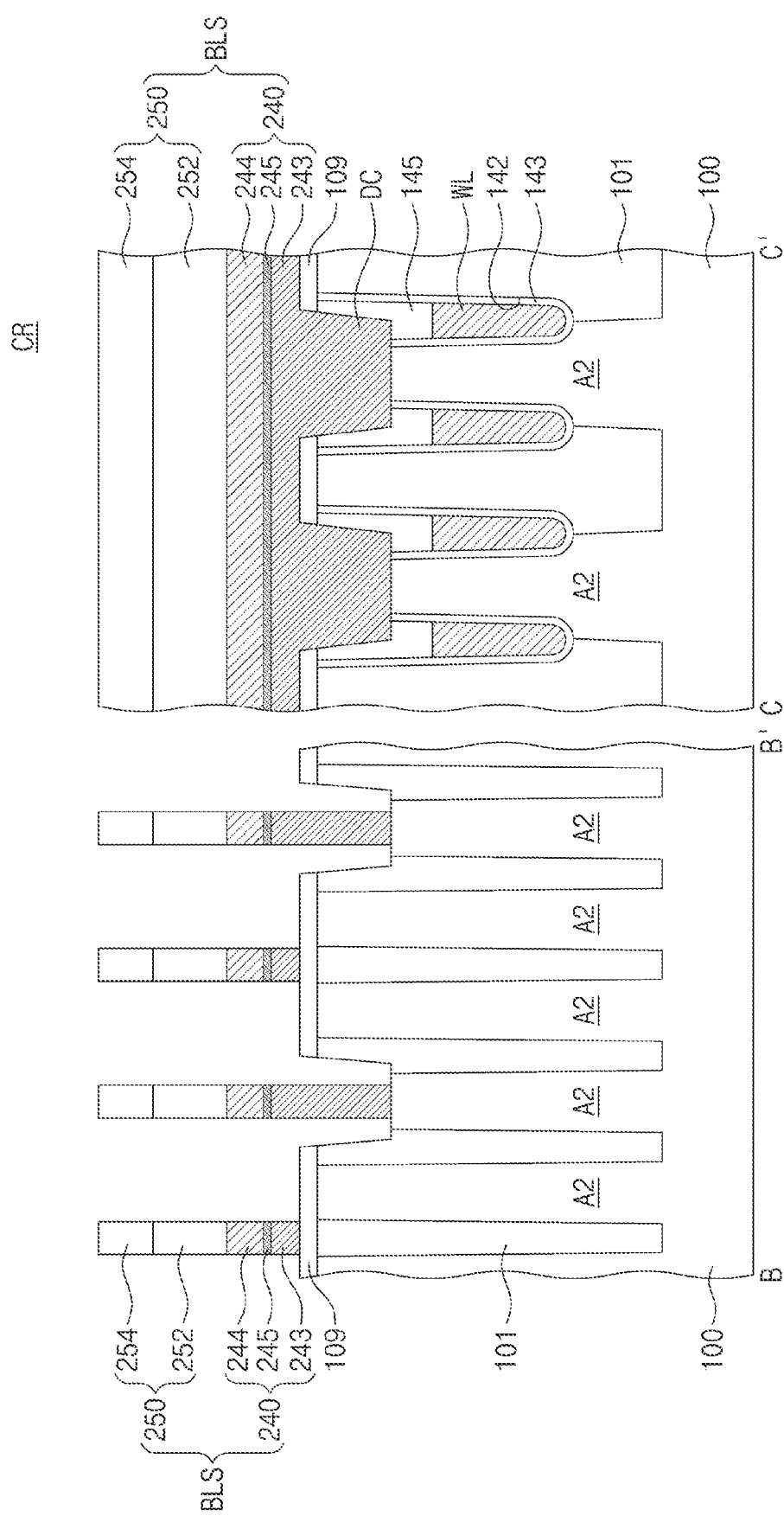
Figure 14B:
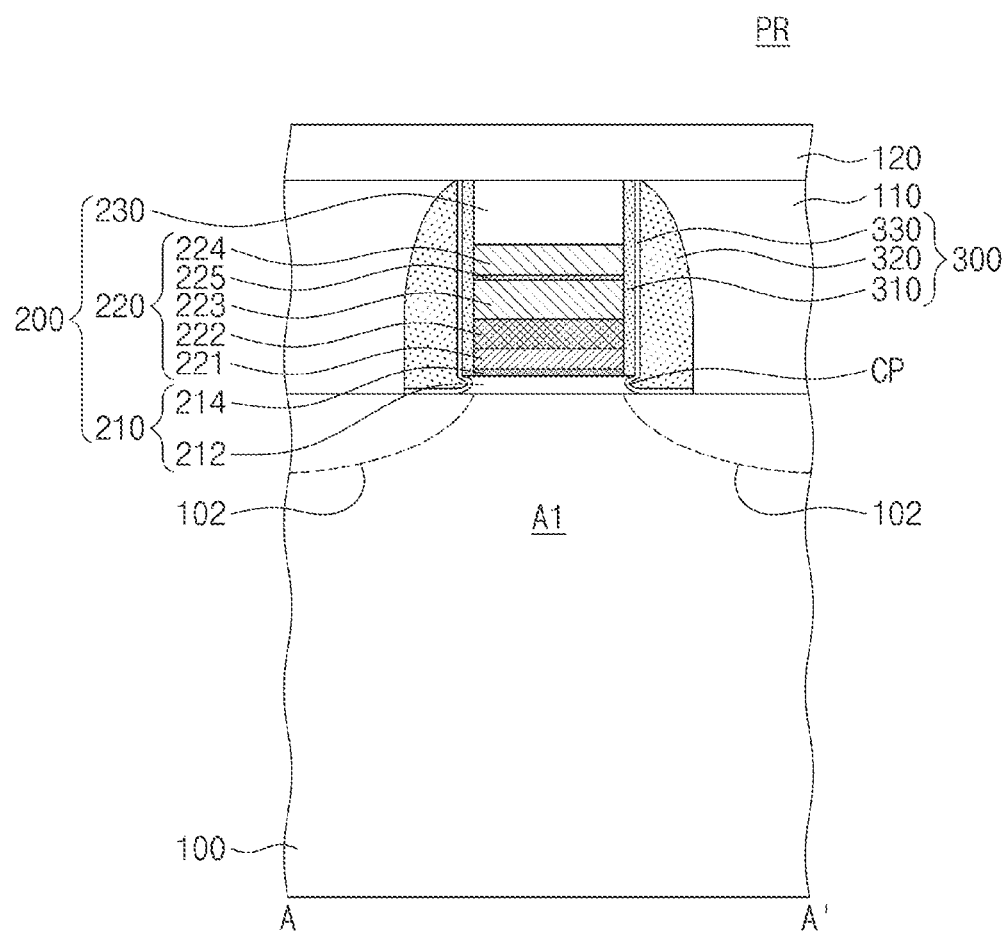

Referring to FIGS. 14A and 14B, a mask may be formed to cover the peripheral circuit region PR, and then bit line structures BLS may be formed on the cell region CR. Each of the bit line structure BLS may include a bit line conductive pattern 240 and a bit line capping pattern 250.

A patterning process may be performed to pattern the third preliminary conductive layer 223p, the preliminary interface layer 225p, the fourth preliminary conductive layer 224p, the preliminary capping pattern 230p, and the second preliminary interlayer insulating layer 120p on the cell region CR of the substrate 100. As a result of the patterning process, the third preliminary conductive layer 223p, the preliminary interface layer 225p, the fourth preliminary conductive layer 224p, the preliminary capping pattern 230p, and the second preliminary interlayer insulating layer 120p may form a first cell conductive layer 243, a cell interface layer 245, a second cell conductive layer 244, a first cell capping pattern 252, and a second cell capping pattern 254. The bit line conductive pattern 240 may include the first cell conductive layer 243, the cell interface layer 245, and the second cell conductive layer 244, and the bit line capping pattern 250 may include the first cell capping pattern 252 and the second cell capping pattern 254.

Figure 15A:
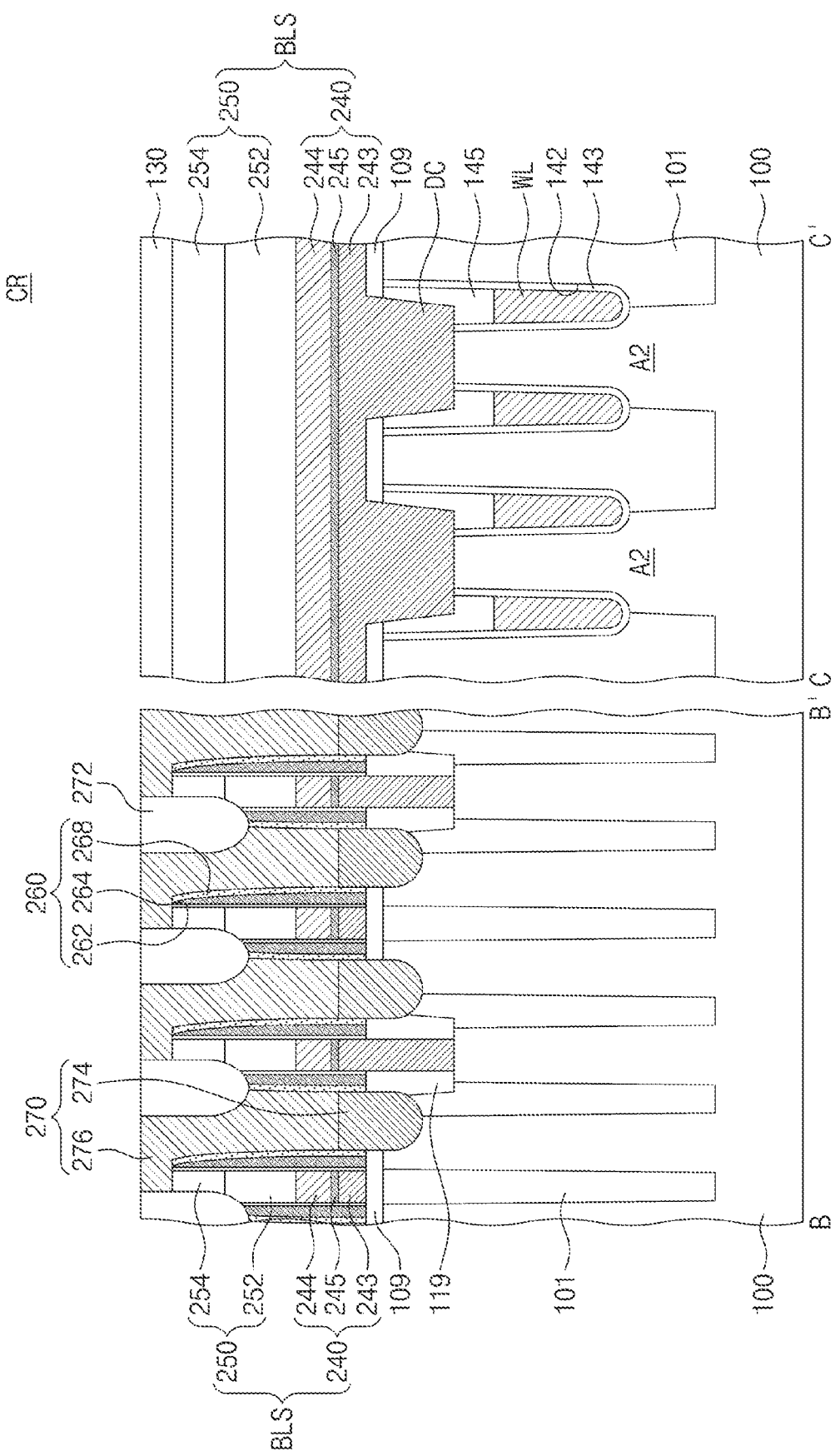

Referring to FIG. 15A, a lower insulating pattern 119 may be formed on a lower side surface of the bit line structure BLS. Next, a bit line spacer 260 may be formed on a side surface of the bit line structure BLS. The bit line spacer 260 may include a first bit line spacer 262, a second bit line spacer 264, and a third bit line spacer 268, which are sequentially stacked on the side surface of the bit line structure BLS.

Thereafter, a landing pad structure 270 may be formed between the bit line spacers 260. The landing pad structure 270 may include storage node contacts 274 connected to the second active regions A2 and landing pads 276 connected to the storage node contacts 274. Upper surfaces of the storage node contacts 274 may be disposed at a level lower than the lower surface of the bit line capping pattern 250 of the bit line structure BLS. The storage node contact 274 may be formed of (or include) at least one of, for example, doped semiconductor materials (e.g., doped silicon), metallic materials (e.g., tungsten, aluminum, titanium, and/or tantalum), conductive metal nitrides (e.g., titanium nitride, tantalum nitride, and/or tungsten nitride), or metal-semiconductor compounds (e.g., metal silicides).

The landing pads 276 may be formed on the storage node contacts 274. The formation of the landing pads 276 may include forming a metal layer on the storage node contacts 274 to cover the bit line spacers 260, planarizing an upper surface of the metal layer, and patterning the planarized metal layer. As a result of the patterning of the metal layer, the landing pads 276 may be electrically disconnected from each other. The bit line spacers 260 and the bit line capping pattern 250 may also be partially removed during the pattering of the metal layer. A space (or partial space) formed by partially removing the metal layer, the bit line spacers 260, and the bit line capping pattern 250, may be filled with an upper insulating layer 272.

Figure 15B:
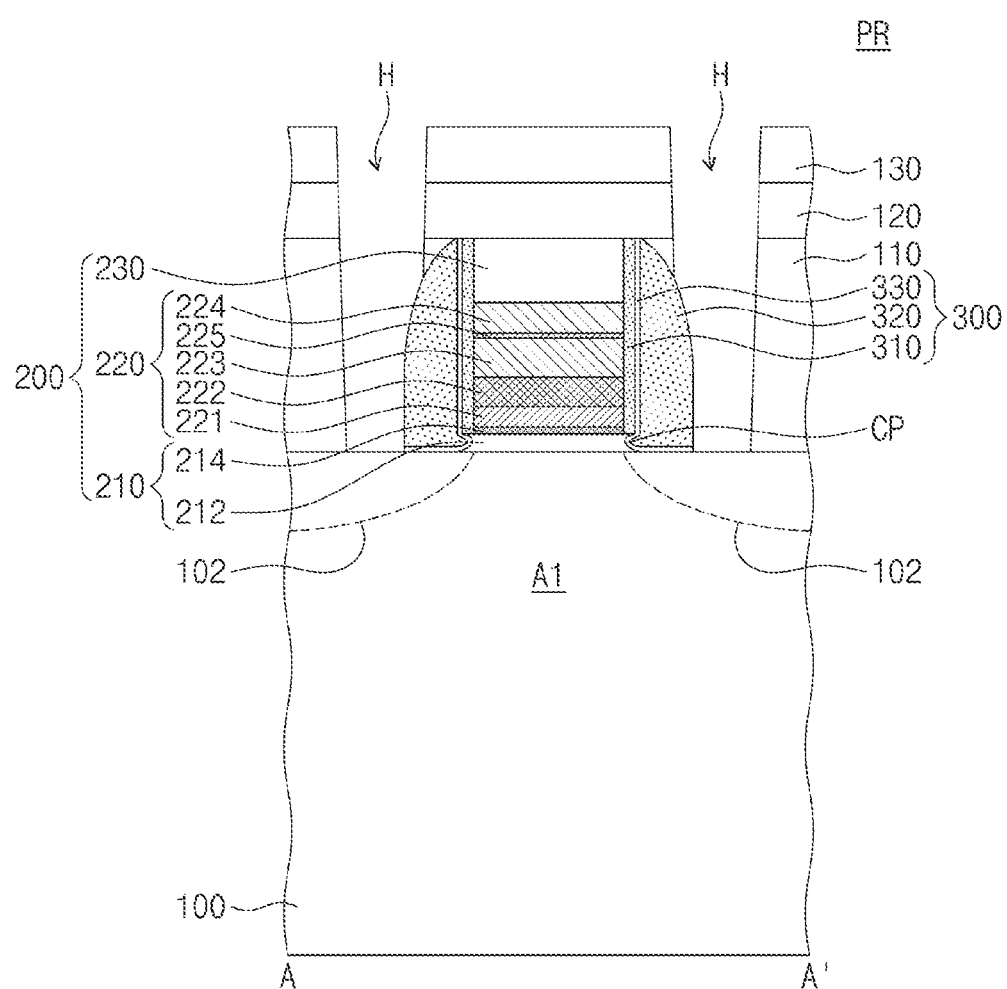

Referring to FIG. 15B, contact holes H may be formed on the peripheral circuit region PR of the substrate 100 to expose the impurity regions 102. The contact holes H may be formed by performing an anisotropic etching process on the first, second, and third interlayer insulating layers 110, 120, and 130. The contact holes H may be partially overlapped with the spacer structure 300. The contact holes H may be vertically overlapped with a portion of the side surface of the second spacer 320.

The first, second, and third interlayer insulating layers 110, 120, and 130 may be formed of (or include) a material having an etch selectivity with respect to the second spacer 320. Thus, the second spacer 320 may not be etched by the anisotropic etching process for forming the contact holes H and may be left in the contact holes H. The contact hole H may have a decreasing width with decreasing distance to the upper surface of the substrate 100. Due to the rounded side surface of the second spacer 320, a lower portion of the contact hole H may have a non-upright or non-linear shape.

Referring to FIG. 3, the contact plugs 410 may be formed in the contact holes H. The formation of the contact plugs 410 may include forming the barrier layers 412 to conformally cover inner surfaces of the contact holes H and forming the conductive patterns 414 to fill the remaining portions of the contact holes H provided with the barrier layers 412. The conductive patterns 414 and the barrier layers 412 may be planarized such that upper surfaces thereof are disposed at the same level as the upper surface of the third interlayer insulating layer 130.

From the foregoing, those skilled in the art will appreciate that embodiments of the inventive concept provide semiconductor devices having improved reliability and reduced fabrication complexity.

While example embodiments of the inventive concept have been particularly shown and described, it will be understood by one of ordinary skill in the art that variations in form and detail may be made therein without departing from the scope of the inventive concept as defined by the following claims.

What is claimed is:

1. A semiconductor device, comprising:
a gate stack including a gate insulating layer and a gate electrode on the gate insulating layer, the gate insulating layer including a first dielectric layer and a second dielectric layer on the first dielectric layer, wherein a dielectric constant of the second dielectric layer is greater than a dielectric constant of the first dielectric layer;
a first spacer on a side surface of the gate stack; and
a second spacer on the first spacer, wherein the second spacer includes a protruding portion extending from a level lower than a lower surface of the first spacer towards the first dielectric layer, and a dielectric constant of the second spacer is greater than the dielectric constant of the first dielectric layer and less than a dielectric constant of the first spacer.

2. The semiconductor device of claim 1, wherein the protruding portion at least partially overlaps the first spacer.

3. The semiconductor device of claim 1, wherein the first spacer is disposed on an upper surface of the first dielectric layer.

4. The semiconductor device of claim 1, wherein the first dielectric layer has a side surface defining a concave portion recessed towards a center of the first dielectric layer, and
the protruding portion fills at least a portion of the concave portion.

5. The semiconductor device of claim 1, further comprising:
a third spacer between the first spacer and the second spacer and having a dielectric constant less than the dielectric constant of the first spacer.

6. The semiconductor device of claim 1, wherein a lower surface of the second spacer is disposed at a level higher than a lower surface of the first dielectric layer.

7. The semiconductor device of claim 1, wherein the dielectric constant of the first spacer is greater than the dielectric constant of the first dielectric layer and less than the dielectric constant of the second dielectric layer.

8. The semiconductor device of claim 1, wherein the first spacer is disposed between the second dielectric layer and the second spacer.

9. The semiconductor device of claim 1, wherein an oxygen content ratio of the second spacer is greater than an oxygen content ratio of the first spacer.

10. The semiconductor device of claim 1, wherein the second spacer comprises SIOCN.

11. A semiconductor device, comprising:
a gate stack on a substrate, the gate stack including a gate insulating layer and a gate electrode on the gate insulating layer, the gate insulating layer including a first dielectric layer and a second dielectric layer on the first dielectric layer, wherein a dielectric constant of the second dielectric layer is greater than a dielectric constant of the first dielectric layer;
a spacer structure on a side surface of the gate stack, the spacer structure including a first spacer and a second spacer on the first spacer, wherein a dielectric constant of the second spacer is less than a dielectric constant of the first spacer;
an interlayer insulating layer covering the spacer structure; and
a contact plug penetrating the interlayer insulating layer to connect the substrate,
wherein the contact plug includes a first side surface adjacent to the second spacer and a second side surface opposite to the first side surface, and
the first side surface has a sunken region recessed towards the second side surface.

12. The semiconductor device of claim 11, wherein an uppermost portion of the sunken region is disposed at a level lower than an upper surface of the first spacer.

13. The semiconductor device of claim 11, wherein a side surface of the second spacer has a rounded shape, and
the first side surface of the contact plug extends along the side surface of the second spacer.

14. The semiconductor device of claim 11, wherein the contact plug directly contacts a side surface of the second spacer.

15. The semiconductor device of claim 11, wherein the first spacer is disposed on an upper surface of the first dielectric layer.

16. The semiconductor device of claim 11, wherein the second spacer includes a protruding portion extending from a level lower than a lower surface of the first spacer towards the first dielectric layer.

17. The semiconductor device of claim 11, further comprising:
a third spacer between the first spacer and the second spacer, wherein a dielectric constant of the third spacer less than the dielectric constant of the first spacer.

18. A semiconductor device, comprising:
a first dielectric layer on a substrate, the first dielectric layer having a side surface defining a concave portion recessed towards a center of the first dielectric layer;
a second dielectric layer on the first dielectric layer, wherein a dielectric constant of the second dielectric layer is greater than a dielectric constant of the first dielectric layer;
a gate electrode on the second dielectric layer;
a gate capping pattern on the gate electrode;
a first spacer on a side surface of the second dielectric layer and a side surface of the gate electrode;
a second spacer on the first spacer;
a third spacer between the first spacer and the second spacer and filling at least a portion of the concave portion;
an interlayer insulating layer covering the third spacer and the gate capping pattern; and
a contact plug penetrating the interlayer insulating layer to connect the substrate,
wherein a dielectric constant of the second spacer is less than the dielectric constant of the first spacer and greater than a dielectric constant of the third spacer.

19. The semiconductor device of claim 18, wherein the second spacer includes a protruding portion extending from a level of a lower surface of the first spacer towards the first dielectric layer.

20. The semiconductor device of claim 18, wherein a lower surface of the second spacer is higher than a lower surface of the first dielectric layer.

* * * * *